(12) United States Patent
Xie et al.

(10) Patent No.: US 9,472,757 B2
(45) Date of Patent: Oct. 18, 2016

(54) METHOD OF MAKING A RESISTIVE RANDOM ACCESS MEMORY DEVICE

(71) Applicant: ASM IP Holding B.V., Almere (NL)

(72) Inventors: Qi Xie, Leuven (BE); Jan Willem Maes, Wilrijk (BE); Tom Blomberg, Vantaa (FI); Marko Tuominen, Helsinki (FI); Suvi Haukka, Helsinki (FI); Robin Roelofs, Leuven (BE); Jacob Woodruff, Scottsdale, AZ (US)

(73) Assignee: ASM IP Holding B.V. (NL)

(*) Notice: Subject to any disclaimer, the term of this patent is extended or adjusted under 35 U.S.C. 154(b) by 14 days.

(21) Appl. No.: 14/334,566

(22) Filed: Jul. 17, 2014

(65) Prior Publication Data

US 2015/0021540 A1 Jan. 22, 2015

Related U.S. Application Data

(60) Provisional application No. 61/856,605, filed on Jul. 19, 2013, provisional application No. 61/975,578, filed on Apr. 4, 2014.

(51) Int. Cl.
*H01L 45/00* (2006.01)
*H01L 21/02* (2006.01)
*H01L 39/24* (2006.01)

(52) U.S. Cl.
CPC ......... *H01L 45/146* (2013.01); *H01L 21/0228* (2013.01); *H01L 21/02175* (2013.01); *H01L 39/249* (2013.01); *H01L 45/08* (2013.01); *H01L 45/12* (2013.01); *H01L 45/1226* (2013.01); *H01L 45/14* (2013.01); *H01L 45/1616* (2013.01); *H01L 45/1641* (2013.01)

(58) Field of Classification Search
CPC .................. H01L 21/02109; H01L 21/02172; H01L 21/02225; H01L 21/0226
See application file for complete search history.

(56) References Cited

U.S. PATENT DOCUMENTS

| | | | |
|---|---|---|---|
| 6,825,135 B2 | 11/2004 | Li et al. | |
| 6,849,868 B2 | 2/2005 | Campbell | |
| 6,855,975 B2 | 2/2005 | Gilton | |
| 6,858,482 B2 | 2/2005 | Gilton | |
| 6,864,500 B2 | 3/2005 | Gilton | |
| 6,867,114 B2 | 3/2005 | Moore et al. | |
| 6,890,790 B2 | 5/2005 | Li et al. | |

(Continued)

OTHER PUBLICATIONS

Ahn et al., "Concurrent presence of unipolar and bipolar resistive switching phenomena in pnictogen oxide $Sb_2O_5$ films," *Journal of Applied Physics*, vol. 112, 114105, 5 pps (2012).

(Continued)

*Primary Examiner* — Cheung Lee
(74) *Attorney, Agent, or Firm* — Knobbe, Martens, Olson & Bear LLP

(57) ABSTRACT

The disclosed technology generally relates to the field of semiconductor processing and more particularly to resistive random access memory and methods for manufacturing such memory. In one aspect, a method of fabricating a memory cell includes providing a substrate and providing a first electrode on the substrate. The method additionally includes depositing, via atomic layer deposition, a resistive switching material on the first electrode, wherein the resistive switching material comprises an oxide comprising a pnictogen chosen from the group consisting of As, Bi, Sb, and P. The resistive switching material may be doped, e.g., with Sb or an antimony-metal alloy. A second electrode may be formed over and in contact with the resistive switching material.

37 Claims, 8 Drawing Sheets

(56) References Cited

U.S. PATENT DOCUMENTS

| | | | |
|---|---|---|---|
| 7,183,207 | B2 | 2/2007 | Kang et al. |
| 8,007,865 | B2 | 8/2011 | Delabie et al. |
| 2008/0116437 | A1* | 5/2008 | Oh .................. H01L 45/06 257/2 |
| 2010/0243983 | A1 | 9/2010 | Chiang et al. |
| 2012/0028410 | A1 | 2/2012 | Marsh |
| 2012/0074376 | A1* | 3/2012 | Kumar ............ G11C 13/0007 257/4 |
| 2012/0127779 | A1 | 5/2012 | Scheuerlein et al. |
| 2012/0248396 | A1 | 10/2012 | Ramaswamy et al. |
| 2012/0305878 | A1 | 12/2012 | Miller et al. |
| 2013/0328005 | A1 | 12/2013 | Shin et al. |
| 2014/0124725 | A1* | 5/2014 | Chi .................. H01L 45/08 257/4 |

OTHER PUBLICATIONS

Ahn et al., "Unipolar resistive switching characteristics of pnictogen oxide films: Case study of $Sb_2O_5$," *Journal of Applied Physics*, vol. 112, 104105, 10 pps. (2012).

Baek et al, "Realization of Vertical Resistive Memory (VRRAM) using cost effective 3D Process," *IEEE*, 978-1-4577-0505-2/11, pp. 31.8.1-31.8.4 (2011).

Chen et al, "Fully CMOS BEOL compatible $HfO_2$ RRAM cell, with low (μA) program current, strong retention and high scalability, using an optimized Plasma Enhanced Atomic Layer Deposition (PEALD) process for TiN electrode," *IEEE*, 978-1-4577-0502-1/11, 3 pps. (2011).

Chen et al., "Hydrogen-Induced Resistive Switching in TiN/ALD $HfO_2$/PEALD TiN RRAM Device," *IEEE Electron Device Letters*, vol. 33, No. 4, pp. 483-485 (Apr. 2012).

Govoreanu et al., "$10 \times 10 nm^2$ $Hf/HfO_x$ Crossbar Resistive RAM with Excellent Performance, Reliability and Low-Energy Operation," *IEEE*, 978-1-4577-0505-2/11, pp. 31.6.1-31.6.4 (2011).

Lee et al, "Multi-level Switching of Triple-layered TaOx RRAM with Excellent Reliability for Storage Class Memory," *IEEE Symposium on VLSI Technology Digest of Technical Papers*, 978-1-4673-0847-2/12, pp. 71-72 (2012).

Peng et al., "Improvement of Resistive Switching Stability of $HfO_2$ Films with Al Doping by Atomic Layer Deposition," *Electrochemical and Solid-State Letters*, vol. 15 (4), pp. H88-H90 (2012).

Office Action dated Mar. 11, 2016 in U.S. Appl. No. 14/334,536.

\* cited by examiner

METHOD OF MAKING A RESISTIVE RANDOM ACCESS MEMORY DEVICE

CROSS REFERENCE TO RELATED APPLICATIONS

This application claims priority under 35 U.S.C. §119(e) to U.S. provisional patent application 61/856,605, filed on Jul. 19, 2013, and to U.S. provisional patent application 61/975,578, filed on Apr. 4, 2014, the contents of which are incorporated herein by reference in their entireties.

BACKGROUND

1. Field

The disclosed technology generally relates to the field of semiconductor processing and more particularly to resistive random access memory and methods for manufacturing such memory.

2. Description of the Related Art

Nonvolatile memory devices are used in a variety of electronic devices such as mobile phones, smartphones, digital cameras, digital music players, tablet computers, and lap top computers, to name a few. As nonvolatile memory devices continue to shrink in size to meet an increasing need for higher device density, there is a correspondingly growing need for three dimensional arrays of memory devices as well as new memory devices that store information based on resistance change.

SUMMARY

In one aspect, a method of fabricating a memory cell comprises providing a substrate and providing a first electrode on the substrate. The method additionally includes depositing, via atomic layer deposition, a resistive switching material on the first electrode, wherein the resistive switching material comprises an oxide comprising a pnictogen chosen from the group consisting of As, Bi, Sb, and P.

In another aspect, a method of fabricating a memory cell comprises forming a first electrode and forming a barrier layer comprising a metal oxide over the first electrode. The method additionally comprises depositing via atomic layer deposition a resistive switching material on the barrier layer, wherein the resistive switching material comprises an oxide comprising a pnictogen chosen from a group consisting of As, Bi, Sb, and P. The method further includes forming a second electrode on the resistive switching material such that the second electrode contacts the resistive switching material.

In another aspect, a resistive random access memory device comprises a memory cell, wherein the memory cell comprises a first electrode, a second electrode, and a resistive switching material contacting and interposed between the first and second electrodes. The resistive switching material comprises an oxide comprising a pnictogen chosen from a group consisting of As, Bi, Sb, and P. At least one of the first and second electrodes comprises TiN.

DETAILED DESCRIPTION

Figure 1:
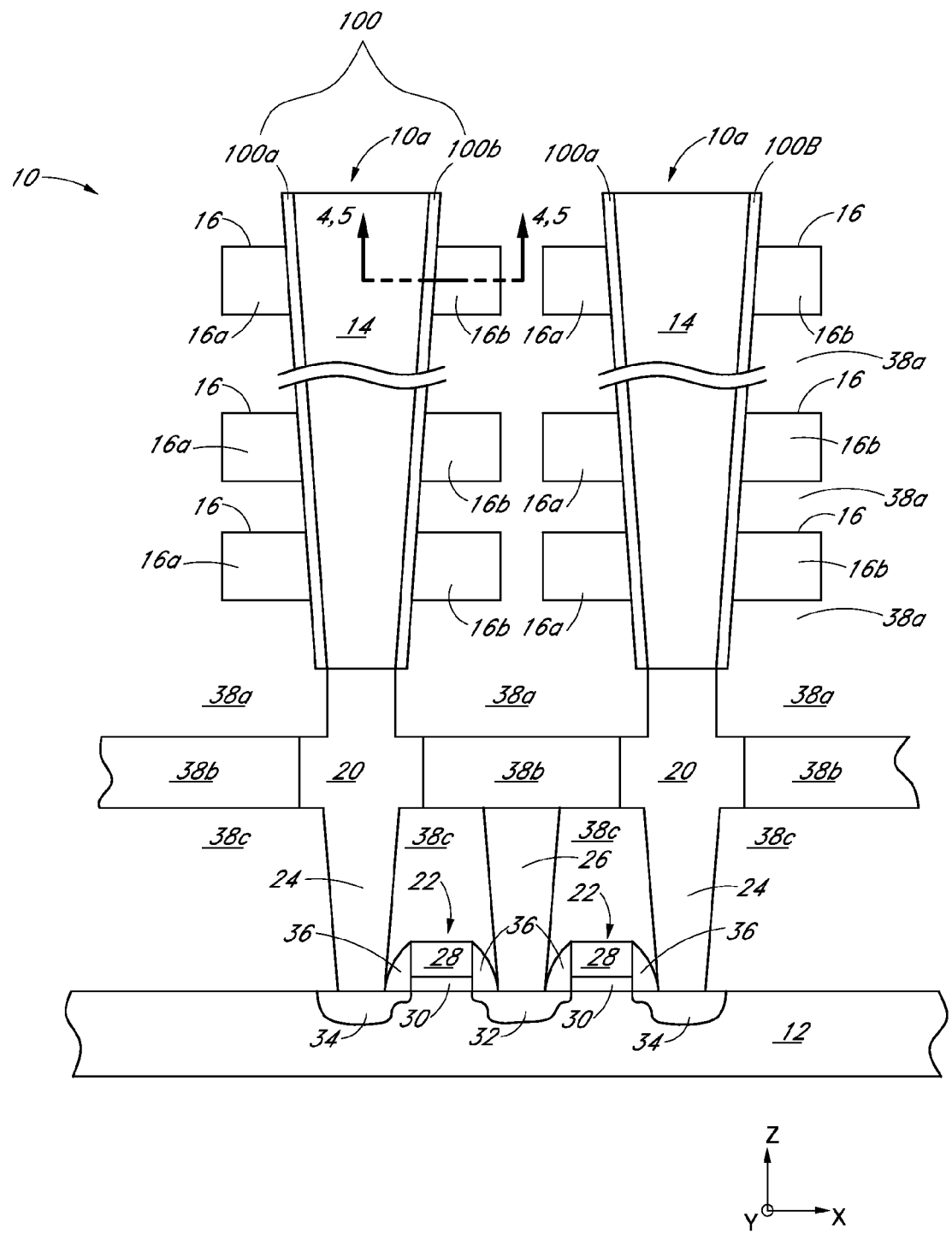
FIG. 1 is a schematic cross-sectional illustration of a 3D RRAM array according to some embodiments.

Electronic devices such as smartphones, computers, and digital cameras store large amounts of data in nonvolatile storage devices such as hard disks or solid state drives. In many mobile applications such as smart phones and mobile computers, solid state drives are often preferred over hard disks because of their compact size as well as relative immunity from reliability issues arising from motion. Solid state drives may comprise, among other things, billions of dual-gate transistors called flash transistors that store charge in floating gates. The flash transistors can be arranged in various forms of array architectures. One particular array architecture known as the NAND array architecture employs flash transistors arranged in strings of 16, 32, 64, or 128 flash transistors whose channels are controlled by word lines that form control gates of the flash transistors. A NAND block can include a plurality of such strings, such as 1024, 2048, etc., where each string is connected to a bit line through a select transistor. NAND array configurations provide one of the highest number of flash transistors per unit area, making them particularly suitable for storing a high density of digital media.

The demand for higher and higher density (and also lower and lower cost) of flash transistors has resulted in continued reduction in size of the flash transistors. As the flash transistors scale below about the 20 nm node, the reliability of the flash transistors can degrade substantially, due to parasitic capacitive coupling between neighboring floating gates and reduction in number of stored electrons per floating gate, among other things. Several scalability concepts are under investigation to allow the density of storage devices to continue to follow the trend of decreasing size and increasing density.

The first scalability concept addresses scalability at the memory cell-level and employs storage devices based on a resistance change of a memory cell, as opposed to changes in the threshold voltage of a flash transistor. Various storage devices based on resistance change have been proposed as alternatives to flash transistors for continued scaling, including resistive-switching random access memory (RRAM). An RRAM device can include a resistance switching layer between two electrodes. The resistance of the switching layer can be switched between a high resistance state (HRS) and a low resistance state (LRS) by application of an electrical signal, e.g., a voltage pulse or a current pulse.

The second scalability concept addresses scalability at the array-level and employs three-dimensional (3D) arrays. For example, in some architectures, "strings" of 16, 32, 64, 128, etc. RRAM devices, or cells, may extend vertically in a direction perpendicular to the surface of the silicon substrate. In one example of a 3D RRAM array, a first set of interconnects, e.g., word lines, extend vertically in a direction perpendicular to the surface of a silicon substrate and a second set of interconnects, e.g., bit lines, extend horizontally in a direction parallel to the surface of the substrate and are configured to form cross junctions with the word lines. RRAM cells are disposed between the word lines and the bit lines at least some of the cross junctions to form RRAM cells such that when an electrical signal is applied across them, the RRAM cells can reversibly switch between LRS and HRS.

A three-dimensional resistive random access memory (3D RRAM) array, according to some embodiments, include a plurality of sub-arrays disposed adjacent to one another in a first horizontal direction, e.g., an x-direction. Each sub-array may include a plurality of first electrode lines stacked vertically in a vertical direction, e.g., a z-direction, and extending horizontally in second horizontal direction, e.g., a y-direction. Each sub-array may further include a plurality of second electrode lines extending vertically in the z-direction. At least some of the second electrode lines may traverse at least one first electrode line and form at least one cross-point junction with one of the first electrode lines. At least some of the cross-junctions, first and second electrode lines may be interposed by a resistive switching stack to form an RRAM cell.

The third scalability concept addresses scalability at the array-level and employs an RRAM cell having lower program and/or erase currents (e.g., SET and/or RESET current) and a non-linear current-voltage (I-V) relationship. An RRAM cell having lower program and/or erase currents can be advantageous for scaling the cell dimensions for several reasons including, for example, integrating with a selector device (e.g., a diode, a thrystor, a diac, an ovonic threshold switch among others) or a current source (e.g., a driving transistor), which may be limited in the amount of available current. By way of example only, an RRAM cell having lateral dimensions of, e.g., 10 nm×10 nm, that can be programmed/erased using 100 µA of current can require up to 100 MA/cm$^2$ of current density from a selector device coupled to the RRAM cell having similar lateral dimensions, which is beyond the amount of current density most diodes can deliver. Thus, an RRAM cell that can be programmed/erased at currents below about 10 µA can be desirable. In addition, an RRAM cell having a non-linear I-V can be advantageous, for example, in avoiding false read-outs due to leakage currents arising from neighboring cells, for example, by having a larger ratio between the amount of current flowing through the RRAM cell at an access voltage and the amount of current flowing through the RRAM cell at a fraction of the access voltage, compared to a similar ratio that may be obtained from an RRAM cell having substantially linear I-V. Furthermore, non-linear behavior can also be advantageous in reducing leakage current from memory cells that are inhibited during an access operation (e.g., write or read). A reduction in leakage current from inhibited memory cells during an access operation in turn can provide an overall reduction of power and/or energy of the access operation per memory cells, which in turn can allow a larger number of integrated memory cells within the array.

Fabrication of 3D RRAM arrays poses unique process integration challenges. For example, in some cases, the 3D RRAM arrays may be fabricated as part of "backend" processing steps, after supporting CMOS circuitry such as drivers and charge pumps have been fabricated in the "frontend" processing steps. Such process architecture allows for a reduction of the overall footprint of the memory array and for achieving higher array efficiency. In addition, under certain circumstances, array fabrication can occur subsequent to fabrication of one or more metallization levels. For these reasons, one set of challenges arises from temperature constraints of processes used to fabricate the 3D RRAM arrays. For example, it has been found that 3D RRAM array processing temperatures of about 450° C. or less are desirable to prevent damage or other detrimental alterations to earlier formed structures, e.g., one of the electrodes. In addition, because the "strings" of RRAM cells can extend vertically over relatively long lengths, deposition or etch of certain materials sometime occur over features having high aspect ratios. Furthermore, it may be desirable to integrate RRAM cells using materials that may not be "traditional" CMOS-compatible materials (e.g., noble metals such as Pt, Au, etc.), that can pose integration challenges (e.g., etch challenges).

Many existing processes may not be compatible with one or more of these scalability concepts. For example, while atomic layer deposition (ALD) processes may be desirable for processing structures having high aspect ratios, some thermal ALD processes that rely on thermal energy for reaction of the precursors on substrate surfaces, may require temperatures greater than the maximum temperature for reliable fabrication as described above. On the other hand, while some plasma-enhanced deposition processes such as plasma-enhanced atomic layer deposition (PE-ALD) can be implemented at sufficiently low temperatures, such PE-ALD processes may not offer the conformality of deposition of different films, such as electrode films and resistive switching materials, that is sufficient for certain vias and cavities having high aspect ratios, particularly for forming vertically extending strings of cells in 3D arrays. Due to the need for a sheath in some cases, plasma processes may not be effective in depositing inside these types of topographies. Furthermore, while certain resistive switching materials can be deposited with sufficient conformality at sufficiently low temperatures, they can require nontraditional CMOS materials, such as noble metal electrodes to operate. Accordingly, there is a need for a resistive switching material stack and methods of fabrication that can be formed at low temperatures with high conformality, and without the need for nontraditional materials such as noble metals. In some embodiments, memory stacks and methods are disclosed that can advantageously meet these criteria, as well as methods of forming such stacks using thermal atomic layer deposition techniques.

In some embodiments, a memory cell is formed by depositing, via atomic layer deposition (ALD), preferably a thermal atomic layer deposition, a resistive switching material over a first electrode. The resistive switching material may comprise an oxide that includes a pnictogen chosen from the group consisting of As, Bi, Sb, and P. In some embodiments, a second electrode may be formed over and in contact with the resistive switching material. In some other embodiments, the resistive switching material may be doped, e.g., with Sb or an antimony-metal alloy, before forming the second electrode. The dopants may be introduced during and/or between the atomic layer deposition cycles for forming the oxide. In some embodiments, a barrier layer may be provided between the first electrode and the resistive switching material.

Advantageously, depositing the resistive switching material by ALD can provide compatibility with a wide range of temperature sensitive materials, while also providing high conformality. It has also been found that an RRAM cell comprising an oxide that comprises a pnictogen can have desirably low peak access currents, e.g., SET and RESET peak currents, such as peak access currents of about $1\times10^{-5}$ A or less. It will be appreciated that metallic layers have generally been deposited directly on the pnictogen oxide, before forming the electrode, in order to form an oxygen deficient pnictogen oxide. Advantageously, it has been found that the pnictogen oxides disclosed herein can provide good electrical properties even without such an oxygen scavenging metallic layer.

Reference will now be made to the Figures, in which like numerals refer to like features throughout.

FIG. 1 illustrates a cross-sectional view of a 3D-RRAM array 10 according to some embodiments. The 3D-RRAM array 10 includes a plurality of sub-arrays 10a formed on a semiconductor substrate 12. The number of sub-arrays within a 3D-RRAM array 10 may be any suitable number according to the particular array architecture and fabrication methods employed. However, for simplicity of illustration, only two such sub-arrays 10a are illustrated in FIG. 1. Each sub-array 10a has at least one other adjacent sub-array in the x-direction. In the illustrated embodiment in FIG. 1, the two sub-arrays 10a are adjacent to and face one another in the x-direction.

Each of the sub-arrays 10a includes a plurality of first electrode lines 16 that are stacked in the z-direction and extending in and out of the page in the y direction. For simplicity of illustration, cross-sections of only three first electrode lines 16 for a given sub-array 10a are illustrated in FIG. 1. However, the number of stacked first electrode lines 16 in a given sub-array may be any suitable number N according to the particular array architecture and fabrication methods employed. In addition, adjacently stacked first electrode lines 16 may be separated by an interposing inter-layer dielectric 38a. Thus, in FIG. 1, a stack of first electrodes for a given sub-array includes N stacked first electrode lines 16 and (N−1) interposing inter-layer dielectric layers 38a. According to various implementations, N, the number of stacked first electrode lines 16, can be, for example, 8, 16, 32, 64, 128, 256, etc., depending on the particular array architecture and fabrication methods employed. The first electrode lines 16 may sometimes be referred to as local bit lines, bit lines, or columns.

Each of the sub-arrays 10a further includes a plurality of second electrode lines 14 extending vertically in the z-direction. In some implementations, the second electrode lines 14 form vertical pillars. For simplicity of illustration, a cross-section of only one second electrode line 14 per sub-array 10a is illustrated in FIG. 1. However, the number of second electrode lines 14 in a given sub-array may be any suitable number M according to the particular array architecture employed. In the configuration of FIG. 1, there may be additional electrode lines 14 (not illustrated) in front of and behind the electrode line whose cross-sectional view is illustrated in FIG. 1, in the y-direction in and out of the paper. According to some implementations, each of the sub-arrays 10a can include, for example, N second electrode lines, where N equals 256, 512, 1024, 2048, 4096, etc., depending on the particular array architecture. The second electrode lines 14 may sometimes be referred to as word lines, local word lines, or rows.

In one example configuration, hereinafter referred to as a "wrapped word line architecture," the second electrode line 14 extends through a vertical via extending through the stack of first electrode lines 16 and inter-layer dielectrics 38a. In some embodiments, the first electrode lines 16 form elongated slabs extending in the y-direction and traverse at least a subset of M second electrode lines 14 in the y-direction. In this configuration, the sidewalls of the vertical vias are lined with a resistive switching stack 100, different parts of which are indicated by 100a and 100b. In addition, the second electrode lines 14 fill the vertical vias lined with the resistive switching stack 100 to form rods, which, in some embodiments, may be cylindrical, extending through the vias that extend through the entire stack of first electrode lines 16 and interposing inter-layer dielectrics 38a. One RRAM cell can be formed at each intersection between a first electrode line 16 and a second electrode line 14, such that the first and second electrode lines 16 and 14 are interposed by a resistive switching stack 100 surrounding the second electrode line 14. When an RRAM cell is selected by applying an appropriate voltage between a selected first electrode line 16 and a selected second electrode line 14, a conductive path can form anywhere across the resistive switching stack 100 surrounding the second electrode line 14. Thus, in the wrapped word line architecture, the RRAM cell comprises a second electrode line 14 extending in the z-direction, a resistive switching stack 100 continuously surrounding the second electrode line 14, and the first electrode line 16 surrounding the resistive switching stack 100. In some embodiments, the second electrode line 14 may take the form of a cylindrical rod. As used herein, "cylindrical" and "rod" structures may have substantially constant widths over their heights or, as illustrated, may have widths that vary, e.g. increase, with height. Cross-sections taken transverse to the height may be substantially circular in some embodiments.

Still referring to FIG. 1, in another example configuration, hereinafter referred to as "intersecting word line architecture," the second electrode line 14 extends through a vertical via extending in the z-direction as in the wrapped word line architecture discussed above. Similar to the wrapped word line architecture, the second electrode line 14 of the intersecting word line architecture extends through a stack of first electrode lines 16a/16b and inter-layer dielectrics 38a interposed between two adjacently stacked first electrode lines 16a/16b. Also similar to the wrapped word line architecture, the sidewalls of the vertical vias, which may be cylindrical, are lined with resistive switching stack 100. In addition, the second electrode lines 14 fill the vertical vias lined with the resistive switching stack 100 to form rods, which may be cylindrical, extending through the vias.

Unlike the wrapped word line architecture, however, the first electrode lines 16a and 16b do not form slabs having holes through which cylindrical second electrode lines 14 extend. Instead, a pair of first electrode lines 16a and 16b extend in the y direction and intersect portions of first and second sides of the second electrode lines 14. Disposed at each intersection between the first electrode lines 16a and 16b are first and second resistive switching stacks 100a and 100b, respectively. That is, each of the pair of first electrodes 16a and 16b form elongated lines extending in the y-direction and "share" one second electrode line 14. Unlike the wrapped word line architecture, therefore, a conductive path can form across each of the first and second resistive switching stacks 100a and 100b, between the second electrode line 14 and one of the selected first electrode lines 16a or 16b. As a result, unlike the wrapped word line architecture, two conductive paths for the same RRAM cell foot print can be formed. Thus, in this configuration, the RRAM cell comprises a second electrode line 14 forming a cylindrical rod extending in the z-direction, a pair of first electrode lines 16a and 16b extending in the y direction and forming a pair of intersections with the second electrode line 14, and first and second resistive switching stacks 100a and 100b interposed between first electrode lines 16a and 16b and the second electrode line 14 at the pair of intersections. It will be appreciated that the stacks 100a and 100b may be different parts of a continuous stack 100.

The 3D RRAM array of FIG. 1 may further comprise one or more transistors 22 connected to the second electrode lines 14. Each of the transistors 22 is formed in the semiconductor substrate 12 and comprises a gate 28, a source 32, a drain 34, and is connected to the second electrode line 14 through a vertical connector 20. Interlayer dielectrics 38b and 38c electrically insulate various conducting structures. In one embodiment, the transistor 22 can provide a selecting function for a second electrode line 14 and can supply the requisite current through suitable biasing of the gate 28 through a gate contact (not shown) and the source 32 through a source contact 26. In some embodiments, the transistors 22 are configured to supply a drive current sufficient to program and erase at least one RRAM cell.

While the sub-arrays 10a are disposed over and overlapping the transistors 22 when viewed in the z-direction in the illustrated embodiment of FIG. 1, other embodiments are possible. In some embodiments, the sub-arrays 10a are disposed over but not overlapping the transistors 22 when viewed in the z-direction. In other embodiments, the transistors 22 are disposed over and overlapping the sub-arrays 10a when viewed in the z-direction. In some other embodiments, the transistors 22 and the sub-arrays 10a are disposed adjacent to each other in the x-direction.

Forming the transistors 22 at different points in the overall fabrication process flow may result in different processing considerations. For example, in the illustrated example of FIG. 1, one consideration arising from the transistors 22 and the associated electrical connections such as vertical connectors 20 being fabricated prior to fabricating the sub-arrays 10a can be a temperature constraint. In some embodiments, high temperature processes subsequent to fabrication of the transistors 22 can lead to undesirable post-fabrication shifts in device parameters such as threshold voltage, sub-threshold swing and punch-thru voltage, among others. In addition, in processes where portions of the vertical connectors include low-temperature melting metals such as Cu or Al, subsequent process temperatures are limited to temperatures where such effects do not pose a significant concern. Thus, it may be desirable to limit the temperature of various processes. In some embodiments, fabrication temperatures for sub-arrays 10a may be lower than about 400° C. In other embodiments, the fabrication temperatures for sub-arrays 10a may be lower than about 350° C. In yet other embodiments, the fabrication temperatures for sub-arrays 10a may be lower than about 300° C.

In addition, as discussed above, various process integration approaches of such 3D RRAM arrays may require conformal deposition of a resistive switching stack and at least one of the first or second electrode lines on surfaces of vias and cavities having high aspect ratios. While plasma-enhanced processes such as PE-ALD may be effective in lowering deposition temperatures for deposition on some exposed surfaces, such processes may not be effective in depositing inside vias and cavities having the high aspect ratios. Advantageously, thermal atomic layer depositions according to embodiments disclosed herein can effectively deposit into high aspect ratio features, for forming various films of the 3D RRAM arrays.

Additionally, in embodiments where the transistors 22 and the associated electrical connections are fabricated prior to fabricating the sub-arrays 10a, usage of plasma processes may pose additional concerns. During a plasma process, certain conducting structures of partially fabricated integrated circuit devices may accumulate charge from the plasma. The accumulated charge can lead to a discharging event during processing, leading to high levels of current flowing through various current paths, for example, through diodes, gate dielectrics of transistors, and RRAM devices. Such discharging events can lead to performance and reliability degradation of the integrated circuit devices, including RRAM devices. For example, a discharging event can lead to a degradation of resistive switching stack. Thus, for these reasons, it may be desirable to use thermally activated processes in lieu of plasma processes and not exceed the backend processing temperature regimes discussed above.

The 3D RRAM array 10 of FIG. 1 can be fabricated in any number of ways. In FIG. 1, starting from the semiconductor substrate 12, structures up to and including the vertical connectors 20 can be fabricated using silicon fabrication processes well known to a person having ordinary skilled in the art. Prior to forming the sub-arrays 10a, a planar surface exposing vertical connectors 20 and inter-layer dielectric layer 38b is provided using various fabrication processes, such as a subtractive metal flow or a dual-damascene flow. In the following, fabrication processes for sub-arrays 10a will be discussed in detail.

Subsequent to formation of vertical connectors 20, in some embodiments, hereinafter referred to as relating to a "bitline-first flow," a stack comprising N layers of interlayer dielectric 38a and N first electrode layers are alternatingly deposited.

The first electrode layer comprises any suitable conductive and semiconductive materials including n-doped poly silicon and p-doped poly silicon, metals including C, Al, Cu, Ni, Cr, Co, Ru, Rh, Pd, Ag, Pt, Au, Jr, Ta, Ti, Hf, Zr, Nb and W, conductive metal nitrides (e.g., transition metal nitrides), conductive metal silicides including tantalum silicides, tungsten silicides, nickel silicides, cobalt silicides, and titanium silicides, and conductive metal oxides including $RuO_2$. In some embodiments, the second electrode material includes a transition metal and may be, for example, a transition metal nitride, such as TiN, TaN, WN, or TaCN. In the bitline-first flow, first electrode layer can be deposited using various processes for depositing a planar film, including chemical vapor deposition (CVD), plasma-enhanced chemical vapor deposition (PE-CVD), plasma-enhanced atomic layer deposition (PE-ALD), and physical vapor deposition (PVD), among others. In some embodiments, the first electrode layer is formed by thermal atomic layer deposition (ALD).

The inter-layer dielectric 38a comprises electrically insulating dielectric material including, for example, $SiO_2$ or $Si_3N_4$, among others. The inter-layer dielectric 38a can be formed using a suitable process for depositing a planar film, such as chemical vapor deposition (CVD), high density chemical vapor deposition (HDP-CVD), and spin-on dielectric processes (SOD), among others.

Subsequently, according to one aspect of the bitline-first flow, vertical vias are formed through the stack comprising N layers alternating interlayer dielectrics 38a and first electrode layers using patterning techniques, e.g., lithography and etch techniques, suitable for forming high aspect-ratio vias. In some embodiments, the vias have a diameter in the range between about 20 nm and about 500 nm, or between about 20 nm to about 100 nm. In addition, in some embodiments, the vias have a depth in the range between about 0.5 μm and about 20 μm, or between about 0.5 μm and about 5 µm. Thus, the aspect ratio of the vias may be about 15 or higher, about 25 or higher, or about 35 or higher.

The sidewalls of the vertical vias may subsequently be lined with a resistive switching stack 100. In some embodiments, the resistive switching stack 100 can include an oxide of a pnictogen, which can include metal oxides that include at least one of As, Bi, Sb, and P. In some embodiments, the resistive switching stack 100 includes antimony oxide. In some other embodiments, the resistive switching stack 100 can include other metal oxide materials, e.g., NiO, $HfO_2$, $ZrO_2$, $Cu_2O$, $TaO_2$, $Ta_2O_5$, $TiO_2$, $SiO_2$, $Al_2O_3$ and/or alloys including two or more metals, e.g., transition metals, alkaline earth metals, and/or rare earth metals. The resistive switching stack 100 can be formed by a thermal atomic layer deposition (ALD), which can be particularly advantageous for forming 3D RRAM memory cells. For example, for vias having relatively high aspect ratios and/or relatively small diameters, ALD-type processes can facilitate the deposition of exceptionally conformal layers. Furthermore, a plasma may not reach deeper portions of high aspect ratio vias under some circumstances. In these circumstances, different portions of vias may be exposed to different amounts of the plasma, leading to undesirable structural effects of non-uniform deposition, such as thicker films being deposited near the opening of the via compared to deeper portions (sometimes called cusping). For these reasons, a thermal ALD may be more advantageous, because thermal ALD does not depend on the ability of the plasma to reach portions of the surface being deposited on.

Subsequently, according to another aspect of the "bitline-first flow," the resistive switching stack 100 formed at the bottom of the vertical vias may be removed by a suitable etch technique in order to make electrical contacts between the transistors 22 and the second electrode lines 14. Subsequently, the vertical vias lined with resistive switching stack 100 are filled with a suitable second electrode material for the second electrode lines 14. Possible second electrode materials include similar materials as first electrode materials. The second electrode material can be deposited using a thermal atomic layer deposition (ALD) in some embodiments. As discussed above in connection with the deposition of resistive switching stack 100, for vias having relatively high aspect ratio and/or relatively small diameters, ALD-type processes can facilitate the deposition of exceptionally conformal layers. In addition, as discussed above for deposition of resistive switching stack, under circumstances where different portions of a via may be exposed to different amounts of the plasma, thermal ALD may provide advantages compared to PE-ALD, so as to avoid undesirable structural effects arising from non-uniform plasma exposure such as higher amounts of the second electrode material being deposited near the opening of the via compared to deeper portions, which can lead to unintended voids within the second electrode lines 14.

Subsequently, according to another aspect of the "bitline-first flow," the sub-arrays 10a may be planarized to remove excess second electrode material. The sub-arrays 10a are then separated, thereby separating the first electrode layer into first electrode lines 16 for each sub-array 10a using suitable lithography and etch techniques for etching through multiple stacks of alternating insulators and conductors. Inter-sub-array gaps formed between the sub-arrays 10a are subsequently filled with inter-layer dielectric 38a and planarized using similar materials and techniques discussed above. Subsequently, additional processes may follow to further connect first electrodes 16 and second electrodes 14 to higher level metal lines.

In some other embodiments, hereinafter referred to as relating to a "bitline-last flow," processes steps prior to forming the sub-arrays 10a are substantially the same as in the bitline-first flow. Subsequently, in contrast to the bitline-first flow, the deposited stack of N layers of interlayer dielectric 38a and N first electrode layers comprise depositing first electrode layers that are sacrificial. Sacrificial first electrode layers may comprise any suitable layer that can be selectively removed later in the process, either by wet etch or dry etch, while not removing the interlayer dielectric 38a nor the resistive switching stack 100. For example, in embodiments where the interlayer dielectric 38a is $SiO_2$, the sacrificial first electrode layers may be $Si_3N_4$ layers or polycrystalline Si layers. Subsequently in the bitline-last flow, the processing steps leading up to and including separating the sub-arrays are substantially similar to bitline-first flow, aside from the fact that materials being etched in forming the vertical vias, for example, include sacrificial first electrode material instead of a permanent first electrode material.

According to one aspect of the bitline-last flow, upon separation of the sub-arrays 10a using suitable lithography and etch techniques, the sacrificial first electrode layers are replaced with permanent first electrode materials to form the first electrode lines 16. The removal of the sacrificial first electrode layer can be performed using wet or dry etch techniques suitable for preferentially removing the sacrificial first electrode material while not removing the interlayer dielectric 38a nor the resistive switching stack 100. For example, in embodiments where the interlayer dielectric 38a is $SiO_2$, the sacrificial first electrode layers are $Si_3N_4$ layers, and the resistive switching stack 100 includes $Sb_2O_5$, a suitable etch process can be a wet-etch that selectively removes $Si_3N_4$ while leaving the $SiO_2$ and the $Sb_2O_5$ intact.

In another aspect of the bitline-last flow, horizontal recessed cavities formed by removal of sacrificial first electrode layers are filled with a suitable permanent first electrode material, which may include substantially the same materials as suitable second electrode materials discussed above in connection with the bitline-first flow. Unlike the bitline-first flow where the first electrode layers can be deposited using various processing techniques for depositing the first electrode layer on a substantially planar surface, some processing techniques may not be suitable for depositing the permanent first electrode material in the bitline-last flow. This is because the permanent first electrode material is deposited on surfaces of horizontal recessed cavities. As a result, processes suitable for depositing permanent first electrode material in the bitline-last flow can include processes similar to those used for depositing the second electrode material into high aspect ratio vias. In some embodiments, the first electrode material is deposited by thermal ALD. It is contemplated that chemical vapor deposition (CVD), plasma-enhanced chemical vapor deposition (PE-CVD), plasma-enhanced atomic layer deposition (PE-ALD) may also be applied to deposit the first electrode material in some circumstances, including where requirements for conformality are more relaxed. As discussed above in connection with deposition of the resistive switching stack 100 and the second electrode material on inner surfaces of vias having relatively high aspect ratio and/or small diameter for bitline-first flow, the second electrode material may be deposited on inner surfaces of horizontal cavities by a thermal ALD process. In addition, as discussed above for the bitline-first flow, because different portions of horizontal cavities may be exposed to different amounts of a plasma, thermal ALD may provide advantages compared to PE-ALD, so as to avoid undesirable structural effects arising from non-uniform plasma exposure such as higher amounts of the second electrode material being deposited in horizontal cavities located near the opening of an inter-sub-array gap compared to horizontal cavities located deeper in the inter-sub-array gap.

Subsequently in another aspect of the bitline-last flow, separated first electrode lines 16 are formed by removing first electrode materials from the sidewall surfaces of the inter-layer dielectric 38a between the first electrode lines 16. Subsequent processes for filling the inter-sub-array gaps between the sub-arrays 10a with inter-layer dielectric 38a and planarizing may be substantially similar as discussed above for bit-line first flow. Also similar to bit-line first flow, additional processes may follow to further connect first electrodes 16 and second electrodes 14 to higher level metal lines.

Figure 2:
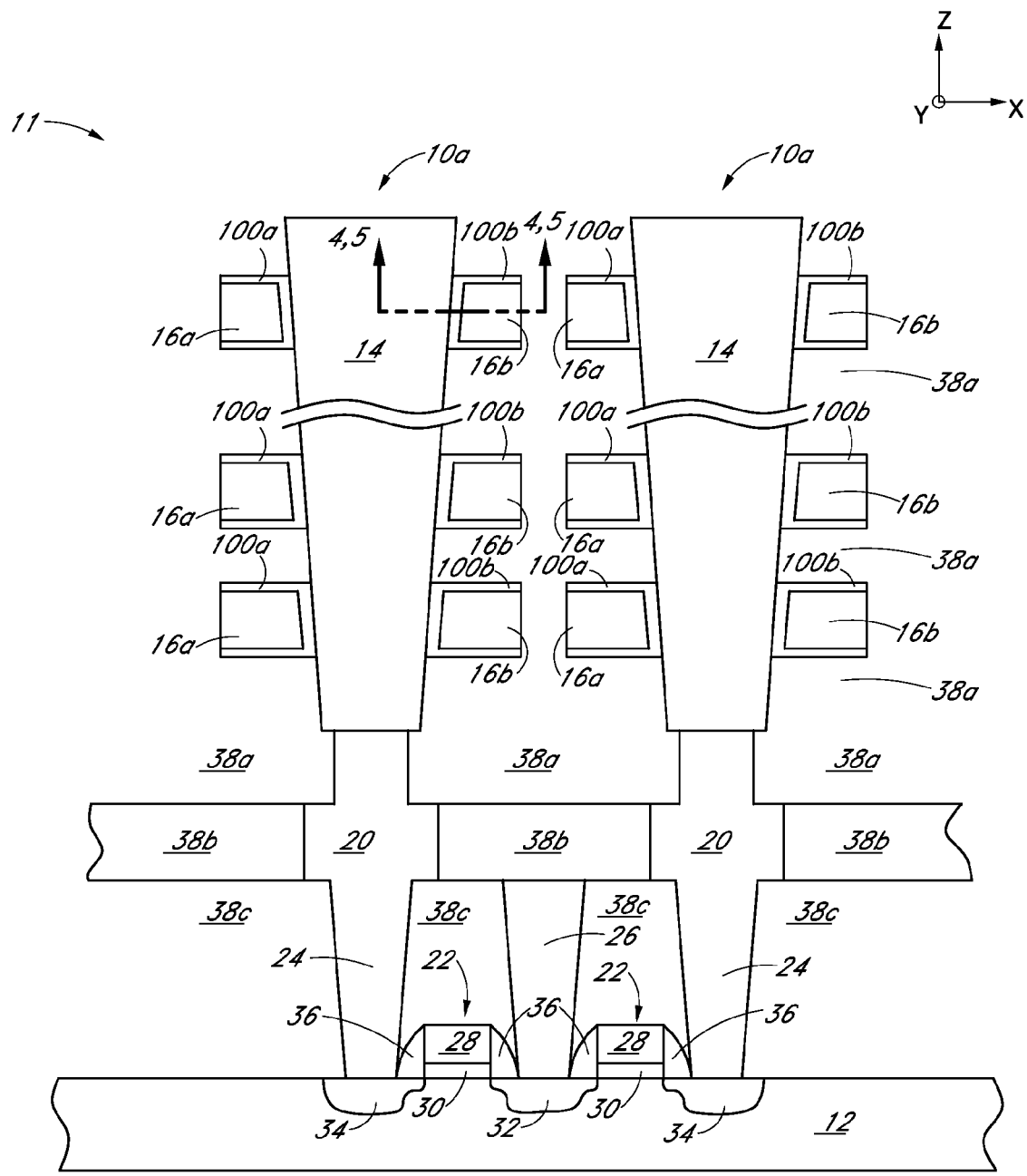
FIG. 2 is a schematic cross-sectional illustration of a 3D RRAM array according to some other embodiments.

FIG. 2 illustrates a cross-sectional view of 3D-RRAM array 40 according to some other embodiments. The overall array architecture of the 3D-RRAM array 40 may be similar to that of the 3D-RRAM array 10 of FIG. 1, and the 3D-RRAM array 40 also includes a plurality of sub-arrays 10a.

The overall sub-array architecture illustrated in FIG. 2 may also be similar to the example of intersecting word line architecture discussed above in connection with FIG. 1, except for certain features, which are described herein. For example, similar to FIG. 1, the second electrode lines 14 extend through a vertical via extending in the z-direction through a stack of pairs of first electrode lines 16a and 16b and interposing inter-layer dielectrics 38a. Unlike the embodiment of FIG. 1, however, first and second resistive switching stacks 100a and 100b of the intersecting word line architecture in FIG. 2 do not line the vertical vias. Instead, first and second resistive switching stacks 100a and 100b line a horizontal cavity formed upon removal of sacrificial first electrode materials, in a similar manner as described above in connection with the bitline-last flow. Accordingly, the second electrode lines 14 fill entire volumes of vertical vias to form cylindrical rods because there is no underlying resistive switching stack.

As a result, the resulting array architecture is similar to the intersecting word line architecture of FIG. 1 in some aspects. For example, each of the pair of electrodes 16a and 16b form elongated lines extending in the y-direction and "share" one second electrode 14 such that two conductive paths are formed for each RRAM cell formed at each of the intersections between one of the first electrodes 16a and 16b and a second electrode 14. Thus, in this embodiment, the RRAM cell comprises a second electrode line 14 rod extending in the z-direction, a pair of first electrode lines 16a and 16b extending in the y direction and forming a pair of intersections with the second electrode line 14, and resistive switching stacks 100a and 100b interposed between first electrode lines 16a and 16b and the second electrode line 14 at the pair of intersections.

The process flow to fabricate the 3D-RRAM array 40 is also similar to the "bitline last" process flow discussed in connection with FIG. 1 in some aspects, except that the resistive switching stacks 100a and 100b are not deposited prior to filling vias with second electrode materials to form the second electrodes 14. Instead, the resistive switching stacks 100a and 100b are conformally deposited in the horizontal recessed cavities formed by removal of sacrificial first electrode layers. The materials and the processes employed to deposit the resistive switching stacks 100a and 100b are similar as in the bit line-last process described above in FIG. 1. Also similar to the bit line-last process described above in FIG. 1, the horizontal cavities formed by removal of sacrificial first electrode layers are then filled with a suitable permanent first electrode material, which includes substantially the same materials as suitable second electrode materials discussed above. In addition, the first electrode material can be deposited using a suitable process for depositing a substantially conformal film into the horizontal cavities, similar to processes used for second electrode material deposition in FIG. 1. Thus, as discussed above in connection with the bitline-first flow of FIG. 1, thermal ALD processes may be preferable compared to PE-ALD for the deposition of resistive switching stacks 100a and 100b, as well as the permanent first electrode material, so as to avoid undesirable structural effects arising from non-uniform plasma exposure such as higher amounts of the second electrode material being deposited in horizontal cavities located near the opening of an inter-sub-array gap compared to horizontal cavities located deeper in the inter-sub-array gap, The 3D-RRAM array 40 having intersecting word line array architecture fabricated using the bitline-last process flow of FIG. 2 may be advantageous over the bitline-first process of FIG. 1 in some aspects. For example, the resistive switching stack 100a and 100b are not exposed to etch and clean chemistries prior to being capped with the second electrode material, thus minimizing contamination and other processing issues such as formation of pinholes in the resistive switching stack.

Previous paragraphs so far addressed 3D RRAM architectures. However, RRAM memory cells according to other embodiments can also be used in embedded nonvolatile memory applications which typically have planar structures based on, e.g., 1T1R configuration (1 transistor 1 resistive element). In this configuration, a resistive element and comprising a first electrode, a switching oxide and a top electrode, can be integrated in several metal levels.

As discussed above, the conducting path of a RRAM cell disposed at an intersection formed by a first electrode line 16 and a second electrode line 14 can be programmed to be in a relatively high resistance state, also known as the RESET state. Similarly, the conducting path of any one of the RRAM cells can be programmed to be in a relatively low resistance state, also known as the SET state. In one embodiment, high and low resistance states may correspond to the "1" state and a "0" state in a single bit-per-cell memory system.

Figure 3:
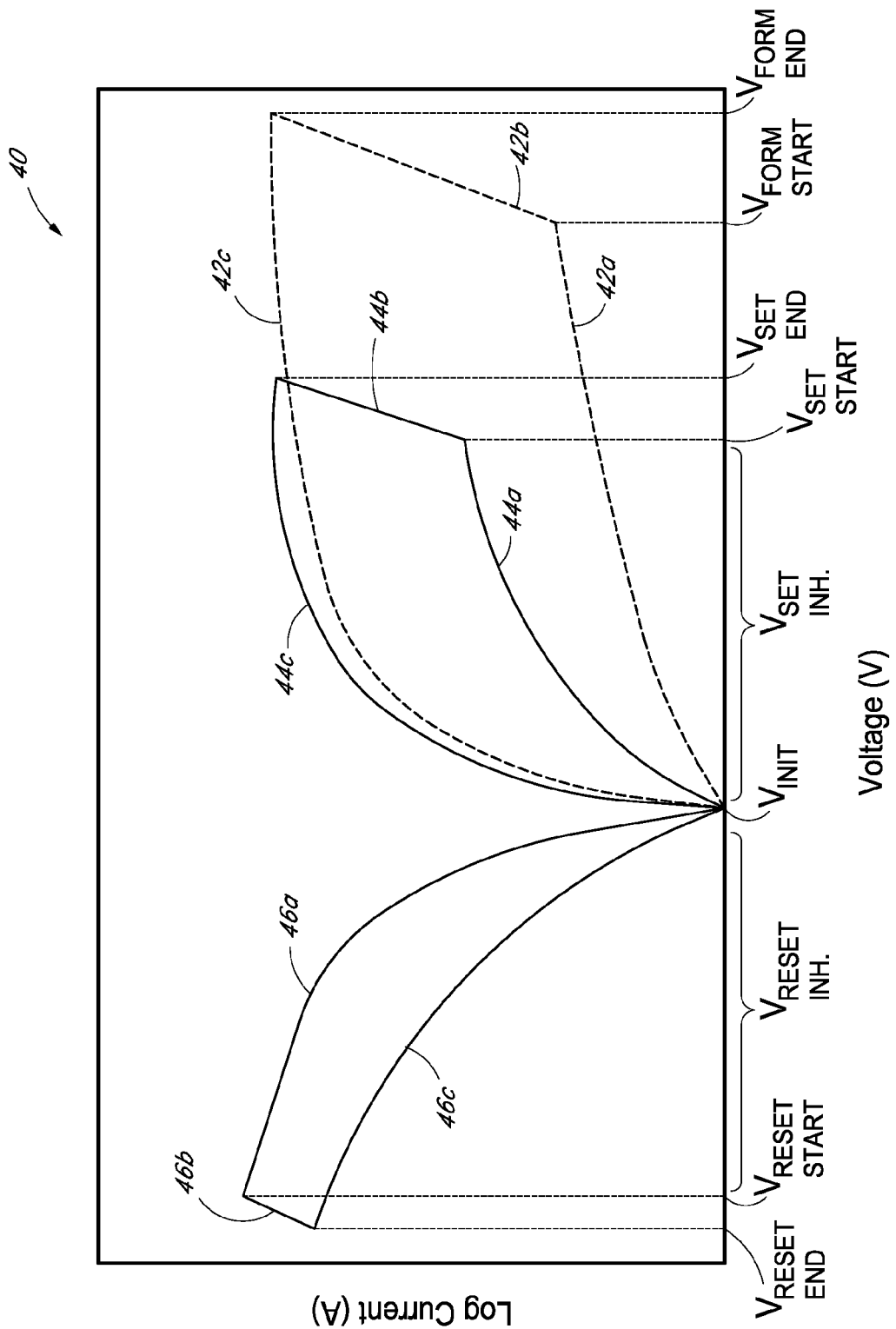
FIG. 3 is a schematic illustration of current-voltage relationships of switching operations of an RRAM cell according to some embodiments.

FIG. 3 represents schematic current-voltage (I-V) curves 40 representing three access operations that can change the state of an RRAM cell. A forming operation refers to the very first electrical pulse applied to an as-fabricated RRAM cell. An electrical pulse, as referred to herein, can include a suitable voltage or current pulse. In addition, the electrical pulse can have varying degrees of voltage and/or current while being applied, e.g., a DC voltage sweep. In FIG. 3, the x-axis represents a voltage applied across the RRAM cell. The y-axis represents the current flowing through the RRAM cell stack at a given voltage.

In FIG. 3, an I-V curve representing the forming operation include a pre-forming high resistance state (HRS) I-V portion 42a ranging in the voltage axis from an initial voltage $V_{INIT}$ to a forming starting voltage $V_{FORM\ START}$ and is characterized by a relatively slow increase in current for a given change in voltage. The I-V curve representing the forming operation further includes a forming HRS-to-LRS transition I-V portion 42b ranging in the voltage axis from $V_{FORM\ START}$ to $V_{FORM\ END}$ and is characterized by a relatively sharp increase in current for a given change in voltage, during which the RRAM cell changes its state from a pre-forming HRS to a post-formed low resistance state (LRS). The I-V curve representing the return path from $V_{FORM\ END}$ to $V_{INIT}$ is represented by a first LRS return path I-V portion 42c.

In some embodiments, forming voltages $V_{FORM\ START}$ and $V_{FORM\ END}$ is related to a breakdown voltage (BV) of the resistive switching material, which can be proportional to the break down electric field. Thus, the forming voltages can depend on factors such as the thickness, density, composition, and the overall quality, among other characteristics, of the resistivity switching oxide layer. As such, these voltages may be controlled by adjusting the deposition parameters such as the deposition temperature and ALD cycle times. It will be appreciated that forming can be performed once after fabrication. In some embodiments, the forming voltage $V_{FORM\ START}$ used to form the RRAM cell can be substantially higher than subsequent corresponding SET and RESET voltages $V_{SET\ START}$ and $V_{RESET\ START}$. Such difference can be disadvantageous since periphery circuitry may have to be over-designed to accommodate the higher voltages used to form the RRAM cell, despite the fact that forming is performed only once. Thus, in various embodiments described herein (e.g., FIGS. 4-6), the difference between forming voltages and SET and RESET voltages can be advantageously adjusted to be lower by adjusting various components of the RRAM cell stack, such as discussed herein.

An I-V curve representing the RESET operation include a LRS I-V portion 46a ranging in the voltage axis from an initial voltage $V_{INIT}$ to a RESET starting voltage $V_{RESET\ START}$ and is characterized by a relatively slow decrease in current for a given change in voltage. In various embodiments described herein (e.g., FIGS. 4-6), the current flowing through the RRAM cell at $V_{RESET\ START}$ can represent a peak value of the current during the RESET operation, whose value can be advantageously adjusted to be lower than about 10 µA by adjusting various components of the RRAM cell stack, such as discussed herein. The I-V curve representing the RESET operation further includes a RESET LRS-to-HRS transition I-V portion 46b ranging in the voltage axis from $V_{RESET\ START}$ to $V_{RESET\ END}$ and is characterized by a relatively sharp decrease in current for a given change in voltage, during which the RRAM cell changes its state from the LRS to HRS. The I-V curve representing the return path from $V_{RESET\ END}$ to $V_{INIT}$ is represented by a HRS return path I-V portion 46c.

An I-V curve representing the SET operation include a HRS I-V portion 44a ranging in the voltage axis from an initial voltage $V_{INIT}$ to a SET starting voltage $V_{SET\ START}$ and is characterized by a relatively slow increase in current for a given change in voltage. This I-V portion is leakier than the analogous I-V portion of the forming I-V curve. The I-V curve representing the SET operation further includes a SET HRS-to-LRS transition I-V portion 44b ranging in the voltage axis from $V_{SET\ START}$ to $V_{SET\ END}$ and is characterized by a relatively sharp increase in current for a given change in voltage, during which the RRAM cell changes its state from the HRS to LRS. In various embodiments described herein (e.g., FIGS. 4-6), the current flowing through the RRAM cell at $V_{SET\ END}$ can represent a peak value of the current during the SET operation, whose value can be advantageously adjusted to be lower than about 10 µA by adjusting various features (e.g., pnictogen and/or dopant concentrations and concentration profiles) of the RRAM cell stack. The I-V curve representing the return path from $V_{SET\ END}$ to $V_{INIT}$ is represented by a second LRS return path I-V portion 44c.

As discussed above, a non-linear current-voltage I-V can be advantageous in some applications, for example, in reducing leakage current from memory cells that are inhibited during an access operation (e.g., a write or read). Still referring to FIG. 3, when a target memory cell is accessed according to a SET operation or a RESET operation as described above by applying an access voltage across a selected bitline and a selected wordline, unselected bitlines and unselected wordlines can be inhibited by applying inhibit biases across the unselected bitlines and wordlines. For example, depending on the array configuration, the I-V curves 40 illustrate that inhibited cells during a SET operation can receive an inhibit bias $V_{SET\ INH}$ between $V_{INIT}$ and $V_{SET\ START}$. Similarly, inhibited cells during a RESET operation can receive an inhibit bias $V_{RESET\ INH}$ between $V_{INIT}$ and $V_{RESET\ INH}$. The amount of leakage current an inhibited cell can conduct while being inhibited depends on, among other things, the degree of nonlinearity of the I-V curve associated with the operation.

As used herein, the degree of nonlinearity can be defined as the ratio between the current through the RRAM cell at a SET switching voltage (e.g., $V_{SET\ START}$) and the current through the RRAM cell at SET inhibit voltage, which can be defined as ½ of the SET switching voltage (e.g., $V_{SET\ START}/2$). As an illustrative example, if the current of a cell in the HRS state at the SET inhibit voltage is 1/1000 of the current at $V_{SET\ START}$, the degree of nonlinearity would be 1000. In this example, if there are 1000 cells in the HRS being inhibited, the total leakage from the 1000 cell can be approximately the same as the current through the cell being switched from HRS to LRS. Similarly, if the current of a cell in the LRS state at the SET inhibit voltage is 1/100 of the current at $V_{SET\ START}$, the degree of nonlinearity would be 100 and if there are 100 cells in the HRS being inhibited, the total leakage from the 100 cell can be approximately the same as the current through the cell being switched from HRS to LRS. Thus, if the array design rule dictates that the total leakage current not exceed the access current, these leakage currents can limit the overall size of the array under a given bias scheme. Advantageously, various embodiments can provide high degrees of non-linearity.

Figure 4A:
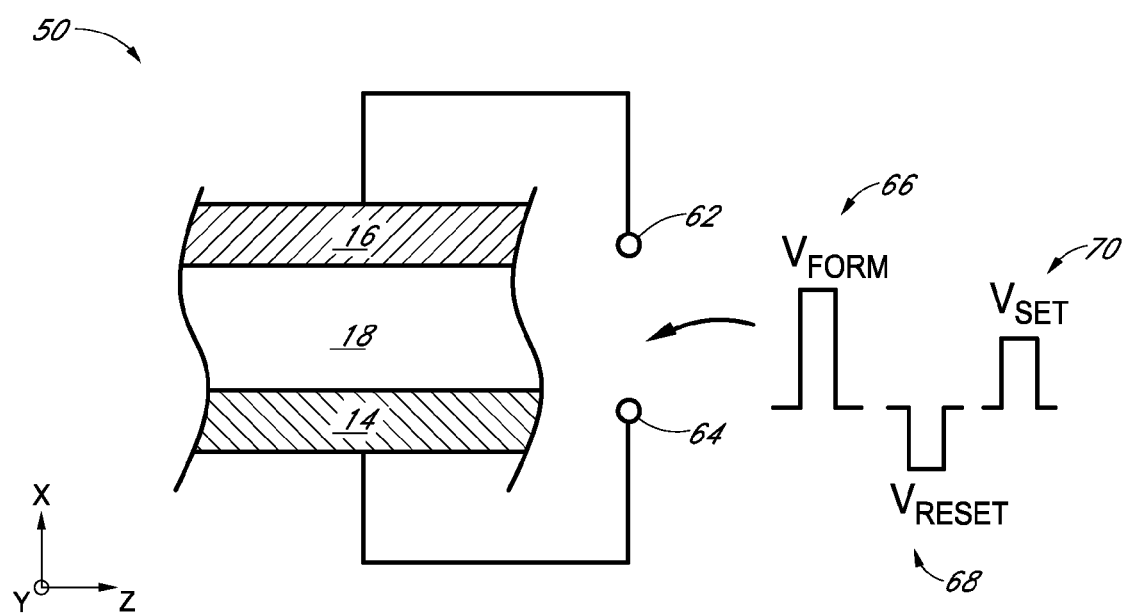
FIG. 4A is a schematic cross-sectional illustration of an RRAM cell stack according to some embodiments.

Referring to FIG. 4A, details, according to some embodiments, of material stacks that comprise the RRAM cells of FIGS. 1 and 2 are disclosed herein. An RRAM cell stack 50 of FIG. 4A can represent a cross-section an RRAM cell taken along the plane 4,5 in FIGS. 1 and 2. The RRAM cell stack 50 comprises a first electrode 16, which may be provided on a substrate (not shown for clarity), a second electrode 14, and a resistive switching material 18 interposed between the first electrode 16 the second electrode 14. The resistive switching material 18 comprises an oxide comprising a pnictogen chosen from the group consisting of As, Bi, Sb, and P. The RRAM cell stack 50 may be fabricated by providing the first electrode 16 on the substrate and depositing via atomic layer deposition the resistive switching material 18 on the first electrode 16, wherein the resistive switching material 18 comprises the oxide comprising the pnictogen. After depositing the resistive switching material 18, the second electrode 14 can be formed on the resistive switching material 18 such that the resistive switching material 18 contacts and is interposed between the first electrode 16 and the second electrode 14.

Generally, a film growth by ALD occurs through a reaction between atomic layers of adsorbed precursors. In a thermal ALD growth process, the film growth occurs through a surface reaction that is driven by thermal energy imparted from the temperature of the substrate. In contrast, in a plasma-enhanced (PE-ALD) growth process, the film growth occurs through a surface reaction that is at least partially driven by a plasma process. As used herein, a thermal ALD process is performed without use of a plasma. It will be appreciated that thermal and plasma ALD may be utilized to deposit various features, such as the resistive switching material 18. As discussed herein, however, depending on the context for the deposition, thermal ALD may provide particular advantages in some embodiments.

For the various ALD depositions described herein, the substrate surface to be deposited upon may be alternatingly exposed to mutually reactive precursors, where a deposition cycle includes exposing a first precursor on the deposition surface and subsequently reacting the absorbed precursor by exposing the deposition surface to a second mutually reactive precursor. Under some circumstances, such a cycle may form a "monolayer" of a reaction product. The cycles (sequential exposures to the first and second precursors) are repeated and the monolayers are deposited over one another until the deposited material reaches a total desired thickness. In some embodiments, the alternating exposure is accomplished by flowing precursors in temporally separated pulses into a deposition chamber that accommodates the substrate. In some other embodiments, the alternating exposure may be accomplished by movement of the substrate and/or reactor parts, without pulsing precursors into the deposition chamber at different times. In the illustrated embodiment of FIG. 4A, the resistive switching material 18 is formed, after forming the first electrode 16, by exposing the substrate, which includes a deposition surface of the first electrode 16, to a plurality of exposures (e.g., cycles), including exposing to a pnictogen-containing reactant and exposing to an oxygen-containing reactant.

In some embodiments, after exposing the substrate to a precursor and before exposing the substrate to another precursor, the substrate may be subjected to a purge step to remove non-absorbed or non-reacted precursor from the vicinity of the substrate. This purge may be accomplished by flowing an inert gas onto the substrate and/or by evacuation of the atmosphere around the substrate. For example, the deposition chamber may be filled with inert gas and/or evacuated with a vacuum pump. It will be appreciated that the deposition chamber may be part of a single substrate reactor, designed to accommodate a single substrate at a time, or the chamber may accommodate multiple substrates, e.g., the chamber may be the deposition chamber of a batch reactor.

With continued reference to FIG. 4A, in some embodiments, the resistive switching material 18 comprises pnictogen oxide, e.g., an antimony oxide, deposited using a pnictogen-containing reactant chosen from the group consisting of pnictogen halides, pnictogen alkoxides, pnictogen alkylamines, pnictogen alkylamides and pnictogen alkylsilyls, or more preferably using a pnictogen-containing reactant chosen from the group consisting of Sb halides, Sb alkoxides, Sb alkylamines, Sb alkylamides and Sb alkylsilyls. As non-limiting examples, the antimony alkoxide may be $Sb(OEt)_3$; the antimony halide reactant may be $SbCl_3$; and the antimony alkylamine reactant may be $Sb(N(CH_3)_2)_3$. The oxygen source may be, for example, ozone. In some embodiments the oxygen source comprises plasma. In some embodiments the oxygen source is an oxygen-containing precursor other than water. Details of the Sb and oxygen reactants that can be used are described below. In the following, it will be understood that while a reference may be made to one particular pnictogen, e.g., Sb, due to similar chemical nature of the pnictogen family of elements, analogous compounds of other pnictogen are equally applicable, so long as chemically feasible. For example, where a halide of one pnictogen, e.g., Sb halide is described, it will be understood that other similar pnictogen halides are equally applicable, such as, for example, Bi halide and P halides.

In some embodiments, the pnictogen-containing reactant comprises an antimony halide. For example, the antimony halide may be $SbCl_3$. In other embodiments the antimony halide may be $SbBr_3$, $SbF_3$ or $SbI_3$. In some embodiments the antimony halide comprises at least one halide ligand. In some embodiments the antimony halide is $SbX_zA_{3-z}$, wherein z is from 1 to 3 and A is a ligand comprising alkylamine, a halide different from X, or an amine, silyl, alkoxide or alkyl group.

In some embodiments, the pnictogen-containing reactant comprises an antimony alkoxide. For example, the pnictogen-containing reactant may comprise $Sb(OEt)_3$. In some embodiments the pnictogen-containing reactant may comprise $Sb(OR)_3$, wherein R is a linear, branched, or cyclic, saturated or unsaturated, C1-C12 alkyl or alkenyl group. The alkyl or alkenyl might also be substituted with substituents such as halogens, amines, silyls etc. In some embodiments the pnictogen-containing reactant may comprise $Sb(OR)_xA_{3-x}$, wherein x is from 1 to 3, and R comprises a linear or branched, cyclic or linear, saturated or unsaturated, C1-C12 alkyl or alkenyl group. The alkyl or alkenyl might also be substituted with substituents like halogens, amines, and silyls. In addition, A comprises a ligand comprising alkylamine, halide, amine, silyl or alkyl.

In some embodiments, the pnictogen-containing reactant comprises antimony alkylamines. The pnictogen-containing reactant may comprise, for example, $Sb(NR_2)_xA_{3-x}$, wherein x is from 1 to 3, and R can be linear, branched or cyclic, saturated or unsaturated, C1-C12 alkyl or alkenyl group. In some embodiments the alkyl or alkenyl might also be substituted with substituents such as halogens, amines, silyls etc. A can be a ligand comprising alkylamine, halide, amine, silyl or alkyl. A specific example of this kind precursor is tris(dimethylamine)antimony, $Sb(NMe_2)_3$. Other non-limiting examples are C2-C3 variants: $Sb(NEt_2)_3$, $Sb(NPr_2)_3$ and $Sb(N^iPr_2)_3$. The R in $Sb(NR_2)_3$ can be linear or branched, cyclic or linear, saturated or unsaturated, C1-C12 alkyl or alkenyl group. The alkyl or alkenyl might also be substituted with substituents like halogens, amines, silyls etc.

Other types of antimony compounds that can be used as the pnictogen-containing reactants include antimony alkyls having the formula $SbR_xA_{3-x}$, wherein x is from 1 to 3, R can be a linear, branched, or cyclic, saturated or unsaturated, C1-C12 alkyl or alkenyl group. In some embodiments the alkyl or alkenyl can also be substituted with substituents like halogens, amines, silyls etc. A is a ligand comprising alkylamine, halide, amine, silyl or alkyl.

While in some of the above-mentioned antimony compounds the oxidation state of antimony is +III, similar antimony compounds, such as alkoxides, halides, alkyls and alkylamines or mixtures or derivatives thereof, can be use that have different antimony oxidation states, like +V.

In some embodiments the oxygen source material for reacting with the antimony source is selected from the group consisting of water, oxygen, hydrogen peroxide, aqueous solution of hydrogen peroxide, ozone, atomic oxygen, oxides of nitrogen, peracids (—O—O—H), alcohols, oxygen-containing radicals and mixtures thereof. Other oxygen sources can also be employed, such as remotely or in situ generated oxygen plasma.

The oxygen source may be a mixture of oxygen and inactive gas, such as nitrogen or argon. In some embodiments the oxygen source may be a molecular oxygen-containing gas. In some embodiments the oxygen content of the oxygen-source gas is from about 10 to 25%. Thus, one source of oxygen may be air. In some embodiments, the oxygen source is molecular oxygen. In some embodiments, the oxygen source comprises an activated or excited oxygen species.

In some embodiments, the oxygen source comprises ozone. The oxygen source may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, ozone is formed inside the reactor, for example by conducting oxygen containing gas through an arc.

In some other embodiments, an oxygen-containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

In some embodiments water is not used as the oxygen source. In some embodiments water is used as an oxygen source. In other embodiments, water is used in combination with one or more additional oxygen sources. The water may be provided with the additional oxygen source or separately. In some embodiments a substrate is exposed to water prior to a exposure to a second oxygen source, such as ozone. In other embodiments, exposure to water is provided subsequent to exposure to a second oxygen source, such as ozone.

In some embodiments, the resistive switching material includes stoichiometric oxides of antimony. As used herein, stoichiometric oxides refer to oxides where the metal atoms and oxygen atoms are not considered to possess bonds that are not chemically satisfied by each other. That is, stoichiometric oxides do not possess a significant amount of dangling bonds or bonds that are satisfied by atomic hydrogen, as understood by the skilled artisan. Stoichiometric oxides of Sb include, for example, $Sb_2O_3$, $Sb_2O_5$ or mixtures thereof. In some embodiments, the resistive switching material includes the stoichiometric oxide $Sb_2O_3$. In other embodiments, the resistive switching material includes stoichiometric oxide $Sb_2O_5$. In other embodiments, the resistive switching material may include stoichiometric oxide having a different stoichiometry.

In some embodiments, the resistive switching material 18 includes a substoichiometric metal oxide, which may be represented by $MO_x$, where M is a pnictogen metal, O is oxygen, and x represents a value less than a stoichiometric saturation value. Where M is antimony, the stoichiometry of the antimony oxide deposited by ALD may be $SbO_x$, where x is from about 1 to about 3 and represents a value which is less than a value corresponding to a stoichiometric oxide.

For example, where the substoichiometric oxide is that of $Sb_2O_3$, x may be less than 1.5, for instance between about 0.5 and 1.5, between about 0.8 and 1.5, or between about 1 and 1.5. For example, where the substoichiometric oxide is that of $Sb_2O_5$, x may be less than 2.5, for instance between about 1.5 and 2.5, between about 1.8 and 2.5, or between about 2 and 2.5.

Deposition temperatures of the resistive switching material 18 can depend upon the surface termination and reactant species involved. In some embodiments, the temperature is preferably about 500° C. or less, about 450° or less, about 400° C. or less, or about 350° C. or less. In some embodiments the deposition temperature is about 50° C. to about 400° C., or about 50° C. to about 350° C. For example, for $SbCl_3$, the deposition temperature is preferably at or above about 35° C., for example about 35° C. to about 500° C., or about 50° C. to about 400° C. In another example, for $Sb(OEt)_3$, the deposition temperature is preferably at or above about room temperature, for example about room temperature to about 500° C., or about 20° C. to about 400° C.

In other embodiments, the resistive switching material 18 comprises antimony oxide deposited by ALD under other conditions, such as those described in U.S. patent application Ser. No. 13/649,992, filed Oct. 11, 2012 (U.S. Application Publication 2013/0095664), the entire disclosure of which is incorporated herein by reference.

Still referring to FIG. 4A, in some embodiments, forming the resistive switching material 18 comprises in situ (i.e., during formation of the resistive switching material 18) doping the resistive switching material 18 with a dopant. The dopant may alter the switching properties of the switching material 18. In some embodiments, dopant atoms can replace atoms of the switching material 18 (e.g., substitutional doping), or can be present as excess atoms of the dopant (e.g., interstitial doping). In addition, as used herein, a dopant can be an element that is present in the resistive switching material 18 (i.e., homogeneous doping). For example, as used herein, when an excess amount of Sb is added to a stoichiometric $Sb_2O_3$ or $Sb_2O_5$ to form a substoichiometric oxide $SbO_x$ having values of x in the ranges described above, the Sb atoms in excess of the stoichiometric value (e.g., 1.5 for $Sb_2O_3$ and 2.5 for $Sb_2O_5$) in the $SbO_x$ is considered to be a dopant. On the other hand a dopant can be an element that is not present in the resistive switching material (i.e., heterogeneous doping).

In some embodiments, the resistive switching material 18 can be in situ doped during the deposition of the resistive switching material 18 by further exposing the substrate to a dopant-containing reactant between exposing the deposition surface to a pnictogen-containing reactant and to an oxygen-containing reactant. For example, in some embodiments, the substrate may be exposed to the dopant-containing reactant after an exposure to the pnictogen-containing reactant and before a subsequent exposure to the oxygen-containing reactant. In some other embodiments, the substrate may be exposed to the dopant-containing reactant after an exposure to the oxygen-containing reactant and before a subsequent exposure to the pnictogen-containing reactant. Thus, in some embodiments, an ALD deposition cycle may be considered to include an exposure to a pnictogen-containing reactant and a subsequent exposure to an oxygen-containing reactant, and doping may be accomplished by exposure to the dopant-containing reactant during or after the ALD deposition cycle.

In some embodiments, exposing the substrate to the dopant-containing reactant comprises homogeneously doping by exposing the substrate to a second pnictogen-containing reactant different from the pnictogen-containing reactant described above as being used to form undoped resistive switching material 18. For example, where depositing an undoped resistive switching material 18 includes exposing the deposition surface to a pnictogen-containing reactant chosen from the group consisting of Sb halides, Sb alkoxides, Sb alkylamides, Sb alkylamides and Sb alkylsilyls, doping the resistive switching material 18 may comprise further exposing the substrate to the second pnictogen-containing reactant, which may be a different pnictogen-containing reactant chosen from the group consisting of Sb halides, Sb alkoxides, Sb alkylamides, Sb alkylamides and Sb alkylsilyls. Examples of the compounds that can be used as pnictogen-containing reactants and/or as second pnictogen-containing reactants that may be used to dope the resistive switching material 18 are now further discussed.

In some embodiments the pnictogen-containing reactant and/or the second pnictogen-containing reactant can be an Sb-containing reactant having an Sb atom bound to three silicon atoms. For example, the Sb-containing reactant can have a general formula of $Sb(AR^1R^2R^3)_3$, wherein A is Si or Ge, and $R^1$, $R^2$, and $R^3$ are alkyl groups comprising one or more carbon atoms. Each of the $R^1$, $R^2$ and $R^3$ ligands can be selected independently of each other. The $R^1$, $R^2$, and $R^3$ alkyl groups can be selected independently of each other in each ligand based on the desired physical properties of the precursor such as volatility, vapor pressure, toxicity, etc. In some embodiments, $R^1$, $R^2$ and/or $R^3$ can be hydrogen, alkenyl, alkynyl or aryl groups. In some embodiments, $R^1$, $R^2$, $R^3$ can be any organic groups containing heteroatoms, such as N, O, F, Si, P, S, Cl, Br or I. In some embodiments $R^1$, $R^2$, $R^3$ can be halogen atoms. In some embodiments the Sb precursor have a general formula of $Sb(SiR^1R^2R^3)_3$, wherein $R^1$, $R^2$, and $R^3$ are alkyl groups comprising one or more carbon atoms. In some embodiments, $R^1$, $R^2$ and/or $R^3$ can be unsubstituted or substituted $C_1$-$C_2$ alkyls, such as methyl or ethyl groups. The $R^1$, $R^2$, and $R^3$ alkyl groups can be selected independently of each other in each ligand based on the desired physical properties of the precursor such as volatility, vapor pressure, toxicity, etc In some embodiments the Sb precursor is $Sb(SiMe_2{}^tBu)_3$. In other embodiments the precursor is $Sb(SiEt_3)_3$ or $Sb(SiMe_3)_3$. In more preferred embodiments the precursor has a Sb—Si bond and most preferably a three Si—Sb bond structure.

In some embodiments the pnictogen-containing reactant and/or the second pnictogen-containing reactant can be an Sb-containing reactant having a general formula of $Sb[A^1(X^1R^1R^2R^3)_3][A^2(X^2R^4R^5R^6)_3][A^3(X^3R^7R^8R^9)_3]$ wherein $A^1$, $A^2$, $A^3$ can be independently selected to be Si or Ge and wherein $R^1$, $R^2$, $R^3$, $R^4$, $R^5$, $R^6$, $R^7$, $R^8$, and $R^9$, can be independently selected to be alkyl, hydrogen, alkenyl, alkynyl or aryl groups. In some embodiments, $R^1$, $R^2$, $R^3$, $R^4$, $R^5$, $R^6$, $R^7$, $R^8$, and $R^9$ can be any organic groups containing also heteroatoms, such as N, O, F, Si, P, S, Cl, Br or I. In some embodiments one or more $R^1$, $R^2$, $R^3$, $R^4$, $R^5$, $R^6$, $R^7$, $R^8$, and $R^9$ can be halogen atoms. In some embodiments $X^1$, $X^2$, and $X^3$ can be Si, Ge, N, or O. In some embodiments $X^1$, $X^2$, and $X^3$ are different elements. In embodiments when X is Si then Si will be bound to three R groups, for example $Sb[Si(SiR^1R^2R^3)_3][Si(SiR^4R^5R^6)_3][Si(SiR^7R^8R^9)_3]$. In embodiments when X is N then nitrogen will only be bound to two R groups $Sb[Si(NR^1R^2)_3][Si(NR^3R^4)_3][Si(NR^5R^6)_3]$. In embodiments when X is O, the oxygen will only be bound to one R group, for example $Sb[Si(OR^1)_3][Si(OR^2)_3][Si(OR^3)_3]$. $R^1$, $R^2$, $R^3$, $R^4$, $R^5$, $R^6$, $R^7$, $R^8$, and $R^9$ groups can be selected independently of each other in each ligand based on the desired physical properties of the precursor such as volatility, vapor pressure, toxicity, etc.

In some embodiments, pnictogen-containing reactant and/or the second pnictogen-containing reactant can be an Sb-containing reactant selected from the group consisting of: $Sb[Si(SiR^1R^2R^3)_3][Si(SiR^4R^5R^6)_3][Si(SiR^7R^8R^9)_3]$, $Sb[Si(NR^1R^2)_3][Si(NR^3R^4)_3][Si(NR^5R^6)_3]$, $Sb[Si(OR^1)_3][Si(OR^2)_3][Si(OR^3)_3]$, and $Sb[SiR^1R^2][SiR^3R^4][SiR^5R^6]$ with a double bond between silicon and one of the R groups. In other embodiments the Sb precursor comprises: a ring or cyclical configuration comprising a Sb atom and multiple Si atoms; or comprises more than one Sb atom. In these embodiments $R^1$, $R^2$, $R^3$, $R^4$, $R^5$ and $R^6$, are selected from the group consisting of alkyl, hydrogen, alkenyl, alkynyl, or aryl groups.

In some embodiments, pnictogen-containing reactant and/or the second pnictogen-containing reactant can be an Sb-containing reactant having a formula similar to the formulas described above, however the Si atom has a double bond to one of the R groups in the ligand (e.g. Sb—Si=). For example, a partial structure of the precursor formula is represented below:

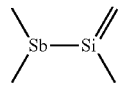

In some embodiments, pnictogen-containing reactant and/or the second pnictogen-containing reactant can be an Sb-containing reactant which contains multiple atoms of Si and Sb. For example, a partial structure of a precursor in one embodiment is represented below:

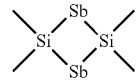

The Si and Sb atoms in the partial formulas pictured above can also be bound to one or more R groups. In some embodiments, any of the R groups described herein can be used.

In some embodiments the pnictogen-containing reactant and/or the second pnictogen-containing reactant can be an Sb-containing reactant which contains a Si—Sb—Si bond structure in a cyclical or ring structure. For example, a partial structure of a precursor in one embodiment is represented below.

The R group can comprise an alkyl, alkenyl, alkynyl, alkylsilyl, alkylamine or alkoxide group. In some embodiments the R group is substituted or branched. In some embodiments the R group is not substituted and/or is not branched. The Si and Sb atoms in the partial formula pictured above can also be bound to one or more R groups. In some embodiments, any of the R groups described herein can be used.

Deposition temperatures of pnictogen-containing reactant and/or the second pnictogen-containing reactant can depend upon the surface termination and reactant species involved. In some embodiments, the temperature is similar to that used to deposit the resistive switching material 18 that is undoped. In some embodiments, the deposition temperature of the resistive switching material 18 is substantially unchanged while exposing the deposition surface to the second pnictogen-containing reactant to dope the resistive switching material in-situ.

In yet other embodiments, exposing the substrate to the dopant-containing reactant comprises exposing the substrate to a third pnictogen-containing reactant in addition to exposing to a second pnictogen-containing reactant, wherein the third pnictogen-containing reactant can be same or different from the pnictogen-containing reactant. Further exposing the substrate to the dopant-containing reactant can include exposing the deposition surface alternatingly to a second pnictogen-containing reactant and a third pnictogen-containing reactant. In some embodiments, the second pnictogen-containing reactant comprises an Sb alkylsilyl having a general formula $Sb(SiR^1R^2R^3)_3$ wherein $R^1$, $R^2$ and $R^3$ are independently selected alkyl groups. In addition, the third pnictogen-containing reactant may comprise an Sb halide. For example, the second and third pnictogen-containing reactants used to dope the resistive switching material can be $Sb(SiEt_3)_3$ and $SbCl_3$, respectively. The growth temperature can range, for example, from about 80° C. to about 120° C.

In some other embodiments, the second pnictogen-containing reactant comprises antimony deposited by ALD using other antimony sources and deposition conditions, such as those described in U.S. patent application Ser. No. 13/504,079, filed Sep. 17, 2012 (U.S. Application Publication 2012/0329208), the entire disclosure of which is incorporated herein by reference.

Without being bound to any theory, doping the resistive switching material 18 with a dopant is believed to give rise to charged oxygen vacancies within the resistive switching material 18, which can become mobile under switching conditions of the RRAM device. In various embodiments, the concentration and the type of dopant can be particularly selected to obtain particular switching and other parameters of the RRAM device, such as the switching voltage, switching current, and data retention.

In some embodiments, the resistive switching material 18 can be in situ doped during the deposition of the resistive switching material 18 by further exposing the deposition surface to a dopant-containing reactant between exposing the deposition surface to a pnictogen-containing reactant and to an oxygen-containing reactant, wherein the dopant-containing reactant comprises a metal different from the pnictogen. In some embodiments, the metal different from the pnictogen can intermix in-situ with the resistive switching material 18 to provide improved switching characteristics.

In some embodiments, exposing the substrate to the dopant-containing reactant comprises exposing the deposition surface to a metal-containing reactant having a metal chosen from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te, among others. In some embodiments, exposing the substrate to the dopant-containing reactant comprises exposing the substrate to a pnictogen-containing reactant chosen from the group consisting of Sb halides, Sb alkoxides, Sb alkylamines, Sb alkylamides and Sb alkylsilyls, and further exposing the substrate to the metal-containing reactant comprises exposing to a metal-containing reactant chosen from the group consisting of halides of the metal, alkoxides of the metal, alkylamines of the metal, alkylamides of the metal, alkylsilyls of the metal, alkyls of the metal, amides of the metal, silylamides of the metal, amidinates of the metal, cyclopentadienyls of the metal, carboxylates of the metal, betadiketonates of the metal and betadiketoimines of the metal, among others.

In some embodiments, the metal-containing reactant is a metal-organic or an organometallic metal-containing reactant. In some embodiments, the metal-containing reactant is a metal-organic or organometallic metal-containing reactant, which does not contain nitrogen. In some embodiments, the metal-containing reactant is a halide metal-containing reactant. In some embodiments, the metal-containing reactant is a halide metal-containing reactant and does not contain any organic groups as ligands. In some embodiments the metal-containing reactant contains only fluorides or chlorides, preferably chlorides, as ligands. In some embodiments, the metal-containing reactant is an adduct metal-containing reactant. Adducts are not considered as a ligands and adducted metal-containing reactant can organic groups as adducts without having organic groups as ligands, for example, here it is considered that $GeCl_2$-dioxane does not have any organic groups as ligands. Ligands are groups or atoms which are directly bonded with the center atom.

In some embodiments, the metal-containing reactants are selected such that a dehalosilylation reaction occurs between the reactants. In some embodiments, the metal-containing reactant is selected so that a dehalosilylation reaction occurs between the metal reactant and a pnictogen-containing reactant (e.g., one of the first, second or third pnictogen-containing reactants disclosed above). In some embodiments, the metal-containing reactant is selected so that a comproportionation reaction occurs between the metal reactant and the pnictogen-containing reactant disclosed above.

Preferred metals in metal-containing reactants include, but are not limited to Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te. In some cases the preferred metal can possibly be rare earth or alkaline rare earth metal.

Possible metal-containing reactants that can be used include Ge halides, such as $GeCl_2$ and $GeBr_2$, adducted derivatives of $GeCl_2$, $GeF_2$ and $GeBr_2$, such as $GeCl_2$-dioxane. Preferably the oxidation state of Ge is +II. Possible metal-containing reactants additionally include Al-containing reactants including Al halides, such as $AlCl_3$, and Al alkyls, such as trimethylaluminum (TMA). Possible metal-containing reactants additionally include Ga-containing reactants including Ga halides, such as $GaCl_3$, and Ga alkyls, such as trimethylgallium (TMG). Possible metal-containing reactants additionally include Zn-containing reactants including elemental Zn, Zn halides, such as $ZnC_2$, and alkyl zinc compounds such $Zn(Et)_2$ or $Zn(Me)_2$. Possible metal-containing reactants additionally include Cu compounds including Cu carboxylates, such as Cu(II)-pivalate, Cu halide, such as CuCl or $CuCl_2$, Cu betadiketonates, such as $Cu(acac)_2$ or $Cu(thd)_2$ and Cu-amidinates. Possible metal-containing reactants additionally include In halides, such as $InCl_3$ and In alkyl compounds, such as $In(CH_3)_3$. Possible metal-containing reactants additionally include Pb alkyls, such as tetraphenyl lead $Ph_4Pb$ or tetraethyl lead $Et_4Pb$. Possible metal-containing reactants additionally include Si-containing reactants including Si halides, such as $SiCl_4$, and amino silanes. Possible metal-containing reactants additionally include Sn-containing reactants including Sn halides, such as $SnCl_4$. Possible metal-containing reactants additionally include Ni-containing reactants including metalorganic Ni compounds, such as $Ni(acac)_2$ or $Ni(C_P)_2$. Possible metal-containing reactants additionally include Cocontaining reactants including metalorganic Co compounds, such as $Co(acac)_2$ or $Co(thd)_2$.

In some other embodiments, the metal-containing reactant comprises others that are described in U.S. patent application Ser. No. 13/504,079, filed Sep. 17, 2012 (U.S. Application Publication 2012/0329208), the entire disclosure of which is incorporated herein by reference.

It will be appreciated that the metal-containing reactant can be exposed after exposing the deposition surface to any of the reactants described above. Thus, in some embodiments, the deposition surface can be exposed to the metal-containing reactant after the surface is exposed to, e.g., immediately after the surface is exposed to, an oxygen-containing reactant (e.g., ozone). In some other embodiments, the deposition surface can be exposed to the metal-containing reactant after the surface is exposed to, e.g., immediately after the surface is exposed to, one of the pnictogen-containing reactant which forms the base oxide of the resistive switching material, a second pnictogen-containing reactant different from the pnictogen-containing reactant, or a third pnictogen-containing reactant different from the pnictogen-containing reactant. In some other embodiments, the deposition surface can be exposed to the metal-containing reactant after the surface is exposed to, e.g., immediately after the surface is exposing to, another one of the metal-containing reactants different from the metal-containing reactant, as described above. By "immediately", e.g., "immediately before" or "immediately after", it is meant that the referenced reactant is the very next or very last reactant, respectively, to which the substrate is exposed.

In some preferred embodiments, doping the resistive switching material 18 includes exposing the resistive switching material 18 to a pnictogen-containing reactant that is one of a halide or alkylilyl compound, and further exposing the resistive switching material 18 to a metal-containing reactant that is the other of a halide or alkylsilyl compound, so that the combination of a halide reactant and an alkylsilyl reactant is provided.

It will be appreciated that the level of doping of the resistive switching material 18 can be selected by appropriate selection of the ratio of exposures of the dopant-containing reactants to exposures of the reactants for forming the pnictogen oxide. It will be appreciated that the pnictogen oxide may be formed in an ALD cycle by exposure to a pnictogen-containing reactant and to an oxygen-containing reactant. Consequently, the amount of doping can be selected by the ratio of the dopant-containing reactant exposures per pnictogen oxide ALD cycles. In some embodiments, a plurality of pnictogen oxide ALD cycles may be performed before an exposure to a dopant-containing reactant. In some embodiments, the ratio of pnictogen oxide ALD cycles to dopant-containing reactant exposures is about 2:1 or more, about 5:1 or more, or about 10:1 or more, including about 2:1 to about 10:1, or about 5:1 to about 10:1, or about 2:1 to about 5:1.

Thus, by exposing the deposition surface to a combination of various reactants as described herein, the resistive switching material 18 can be singly doped or co-doped using any one or more of the pnictogen of the base resistive switching material 18, a pnictogen different from the pnictogen of the base resistive material 18 and any one or more metals selected from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te.

In some embodiments, in-situ doping comprises further exposing the substrate to a plurality of exposures of one or more of dopant-containing reactants described above, wherein a number or a duration of exposures of the one or more of dopant-containing reactants per a thickness of the resistive switching material 18 varies across a thickness of the resistive switching material such that the resistive switching material has an as-deposited gradient in dopant concentration across the thickness of the resistive switching material 18. In some embodiments, the doping concentration can have an increasing or decreasing dopant concentration from a first interface (e.g., the interface between the resistive switching material 18 and the first electrode 16) of the resistive switching material 18 to a second interface (e.g., the interface between the resistive switching material 18 and the second electrode 14). In some other embodiments, the dopant concentration can have a peak concentration between the first interface of the resistive switching material 18 and the second interface. In various embodiments, the dopant concentration can have any profile, such as a linear profile, an exponential profile, a logarithmic profile, a Gaussian profile and a Lorentzian profile, among other profiles that can be generated by the in-situ doping techniques described herein.

In some embodiments, the thickness of the resistive switching material 18 has a range between about 40 nm and about 1 nm, for instance about 20 nm. In some embodiments, the thickness of the resistive switching material 18 has a range between about 20 nm and about 1 nm, or between about 10 nm and about 1 nm, for instance about 5 nm.

In some embodiments, in-situ doping comprises forming a dopant layer, wherein the dopant layer comprises more than a monolayer of the dopant atoms, and wherein the dopant layer is interposed between layers of the oxide of the resistive switching material 18. In some embodiments, the dopant layer has a thickness between about 20 nm and about 0.5 nm, between about 10 nm and about 0.5 nm, or between about 5 nm and about 0.5 nm.

In some embodiments, the resistive switching layer 18 comprises a nanolaminate comprising alternating dopant layers and oxide layers, wherein the dopant layers and oxide layers have thicknesses described above.

In some other embodiments, the resistive switching layer 18 comprises a nanolaminate comprising alternating dopant layers and oxide layers, wherein the dopant layers have thicknesses that vary across a thickness of the resistive switching material and/or the oxide layers have thicknesses that vary across the thickness of the resistive switching material such that the resistive switching material has an as-deposited gradient in dopant concentration across at least a portion of the thickness of the resistive switching material 18.

In some embodiments, a gradient in the concentration of the dopant exists cross the thickness of the resistive switching material 18 such that a difference between a highest and a lowest value of a concentration profile can exist, wherein the difference can exceed 1%, 5%, or 10%.

In some embodiments, either one or both of first and second electrodes 16 and 16, which may be 14 formed by ALD, e.g. thermal ALD, includes a transition metal nitride layer, e.g., a TiN layer or a TaN layer, formed at a temperature below about 400° C. In some other embodiments, one or both of first and second electrodes 16 and 14 includes a transition metal nitride layer, e.g., a TiN layer or a TaN layer, formed by ALD, e.g. thermal ALD, at a temperature between about 300° C. and about 400° C., or between about 300° C. and about 350° C.

In some embodiments, either one or both of first and second electrodes 16 and 14 formed by thermal ALD includes a transition metal nitride layer, e.g., a TiN layer or a TaN layer, having a thickness of about 1 nm to about 100 nm. In some other embodiments, one or both of first and second electrodes 14 and 16 includes a transition metal nitride layer, e.g., a TiN layer or a TaN layer, having a thickness of about 5 nm to about 50 nm. In yet other embodiments, one or both of first and second electrodes 16 and 14 includes a transition metal nitride layer, e.g., a TiN layer or a TaN layer, having a thickness of about 5 nm to about 30 nm, for instance 10 nm.

With reference to FIG. 4A, in operation, the first and second electrodes 14 and 16 can be electrically connected to first and second pads 62 and 64. In some embodiments, the forming or the SET operation can be performed under a biasing condition where the first electrode 16 is biased positively relative to the second electrode 14 using positive pulses $V_{FORM}$ 66 and $V_{SET}$ 70, respectively, and the RESET operation can be performed using a negative pulse $V_{RESET}$ 68. In some other embodiments, the polarity of the pulses can be reversed. Without being bound to any theory, depending on the polarity of the bias, a net movement of metal atoms and/or oxygen vacancies may occur from one of the sides of the first and second electrodes 16 and 14 towards the other one of the sides of the first and second electrode 16 and 14, a net movement of oxygen atoms may occur in a direction opposite to the metal atoms and/or oxygen vacancies, or both net movements of metal atoms and/or oxygen vacancies and oxygen atoms may occur in opposite directions.

Figure 4B:
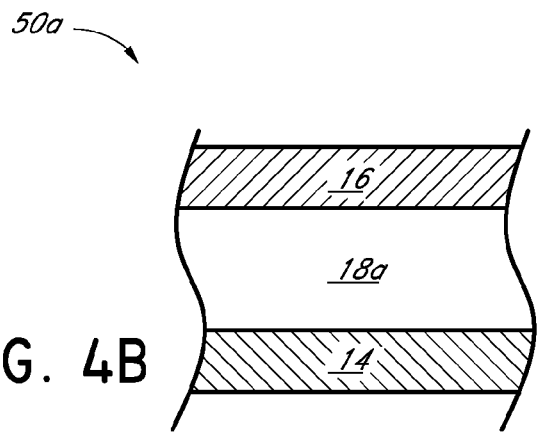
FIGS. 4B-4D are schematic cross-sectional illustrations of the RRAM cell stack of FIG. 4A at various stages of operation, according to some embodiments.
Figure 4C:
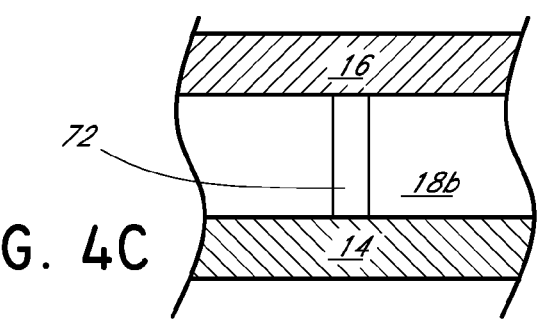
Figure 4D:
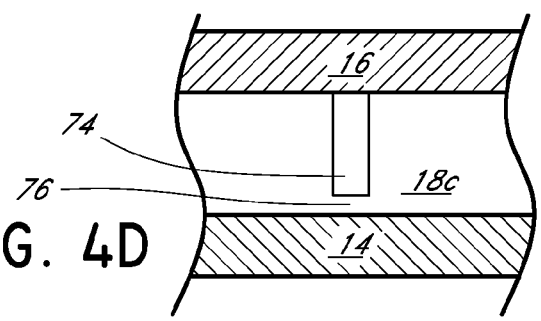

In FIGS. 4B to 4D physical changes to the resistive switching material 18 as they may occur during operation is described, according to some embodiments. While certain physical phenomena may be described herein as best understood, any embodiments described herein are not bound to any specific theory. FIG. 4B illustrates a cross-sectional view of an unformed RRAM cell stack 50a of the RRAM cell of FIG. 4A, according to some embodiments. Similar to FIG. 4A, the unformed RRAM cell stack 50a comprises a first electrode 16, a second electrode 14, and a resistive switching material 18a comprising an oxide comprising a pnictogen element formed by atomic layer deposition (ALD), wherein the resistive switching material 18a is interposed between and contacts each of the first electrode 16 and the second electrode 14. The unformed RRAM cell stack 50a of FIG. 4B can be characterized as having a resistive switching material 18a that is a pnictogen oxide, or, in some other embodiments, that has as-deposited concentration profiles of elements of the base pnictogen oxide and dopants as described above, and may not have substantially localized conduction paths. Electrically, the unformed RRAM cell stack 50a can display a relatively homogenous conduction through the resistive switching material 18a. For example, unformed RRAM cell stacks 50a having different areas can display a relatively constant current density under a moderate read bias smaller than switching biases $V_{FORM}$ 66, $V_{SET}$ 70 and $V_{RESET}$ 70.

FIG. 4C illustrates a cross-sectional view of an as-formed or as-SET RRAM cell stack 50b of the RRAM cell of FIG. 4A, according to some embodiments. That is, the as-formed or as-SET RRAM cells stack 50b can represent the RRAM cell stack 50a after receiving pulses $V_{FORM}$ 66 and/or $V_{SET}$ 70 as illustrated in FIG. 4A. The as-SET RRAM cell stack 50b is similar to the unformed RRAM cell stack 50 of FIG. 4B, except the as-formed or as-SET RRAM cell stack 50b can additionally include a localized conduction path 72 within the resistive switching material 18a that may develop within the resistive switching material 18a of FIG. 4B under biased pulses $V_{FORM}$ 66 and $V_{SET}$ 70. Without being bound to any theory, it will be appreciated that the localized conduction path 72 can develop for a number of reasons. For example, the localized conduction path 72 can be initiated at a localized region where the electric field can be enhanced due to a smaller resistive switching material thickness and/or a relatively sharp boundary between the resistive switching material 18a and one or both of the first electrode 16 and the second electrode 14.

In some embodiments, the localized conduction path 72 can have a localized stoichiometry substantially different from the bulk resistive switching material 18b. For example, where the resistive switching material 18b of FIG. 4C is represented by $MO_x$, where M includes a pnictogen metal or a mixture of a pnictogen metal and a dopant metal, O is oxygen, and x represents a value equal to or less than the stoichiometric saturation value, the localized conduction path 72 can be represented by $MO_y$, where y is substantially less than x, for example by greater than 10%. Without being bound to any theory, such differences in composition between the localized conduction path 72 and the bulk resistive switching material 18b can be associated with movements of metallic atoms or ions, movements of oxygen atoms or ions, movement of oxygen vacancies, or any combination thereof, into and/or out of the conductive path 72 and the surrounding regions.

In some embodiments, the as-SET RRAM cell stack 50b of FIG. 4C can be characterized electrically by a relatively localized conduction through the localized conduction region 72. For example, as-SET RRAM cell stack 50b having different areas can display a relatively constant current under a moderate read bias smaller than switching biases.

In some embodiments, the as-formed or as-SET RRAM cell stack 50b of FIG. 4C can be characterized electrically by a relatively Ohmic conduction having a relatively linear current-voltage (I-V) relationship. In other embodiments, the as-formed or as-SET RRAM cell stack 50b of FIG. 4C can be characterized electrically by a relatively non Ohmic conduction having a relatively nonlinear current voltage (I-V) relationship. For example, the I-V relationship can have an exponential or a power-law relationship.

It will be appreciated that while FIG. 4C depicts a single localized conduction path 72 having a particular shape, representation is for illustrative purposes only and actual configurations can be different. For example, in some embodiments, the as-SET RRAM cell stack 50b of FIG. 4C can have multiple localized conduction paths 72. In addition, the shape can take any arbitrary form. Alternatively, the conduction path may be non-localized and extend over the entire cell area.

FIG. 4D illustrates a cross-sectional view of an as-RESET RRAM cell stack 50c of the RRAM cell of FIG. 4A, according to some embodiments. That is, the as-RESET RRAM cells stack 50c can represent a previously formed or SET RRAM cell stack 50b of FIG. 4C, after having received the pulse $V_{RESET}$ 68. The as-RESET RRAM cell stack 50c is similar to as-SET RRAM cell stack 50b of FIG. 4C, except the as-RESET RRAM cell stack 50b can include a localized conduction path 74 within the resistive switching material 18c that is different from the localized conduction path 72 of FIG. 4C. Under biased pulses $V_{RESET}$ 68, the localized conduction path 72 of a previously SET RRAM cell stack 50b of FIG. 4C can become a localized conduction path 74 that is different from the localized conduction path 72 of FIG. 4C. It will be appreciated that the localized conduction path 74 can become different from the localized conduction path 72 of FIG. 4C for a number of reasons. For example, the localized conduction path 72 can become discontinuous due to formation of a gap region 76 as illustrated in FIG. 4D. In addition, the localized conduction path 74 itself can become less conductive compared the localized conduction path 72 of FIG. 4C.

In some embodiments, similar to the localized conduction path 72 of FIG. 4C, the localized conduction path 74 can have a localized stoichiometry substantially different from the bulk resistive switching material 18c. For example, the stoichiometry of the localized conduction path 74 can be represented by $MO_z$, where z is substantially less than x of the bulk resistive switching material 18c represented by $MO_x$, for example by greater than 10%.

In addition, the localized conduction path 74 of FIG. 4D can also be substantially modified with respect to the localized conduction path 72 of FIG. 4C with respect to the composition, the shape, and the dimensions.

Without being bound to any theory, formation of the gap region 76 can be associated with movements of metallic atoms or ions, movements of oxygen atoms or ions, movement of oxygen vacancies, or any combination thereof, into and/or out of the gap region 76. In addition, the stoichiometry of gap region 76 can have a value between that of the bulk resistive switching material 18c and that of the localized conduction path 74.

In some embodiments, similar to the as-SET RRAM cell stack 50b of FIG. 4C, the as-RESET RRAM cell stack 50c of FIG. 4D can also be characterized electrically by a relatively localized conduction through the localized conduction path 74 and through the gap region 76. For example, as-RESET RRAM cell stack 50c having different areas can display a relatively constant current under a moderate read bias smaller than switching biases.

In some embodiments, the as-RESET RRAM cell stack 50c of FIG. 4D can be characterized electrically by a relatively non-linear current-voltage (I-V) relationship. In some embodiments, the degree of non-linearity of the as-RESET RRAM cell stack 50c can be substantially higher compared to the as-SET RRAM stack 50b of FIG. 4C.

It will be appreciated that while FIG. 4D depicts a single localized conduction path 74 having a particular shape, representation is for illustrative purposes only and actual configurations can be different. For example, in some embodiments, the as-RESET RRAM cell stack 50c of FIG. 4D can have multiple localized conduction paths 74. In addition, the shape can take any arbitrary form. In addition, the location of the gap region can be anywhere between the first and second electrodes. Alternatively, the conduction path may be non-localized and extending over an entire area of the cell.

Figure 5A:
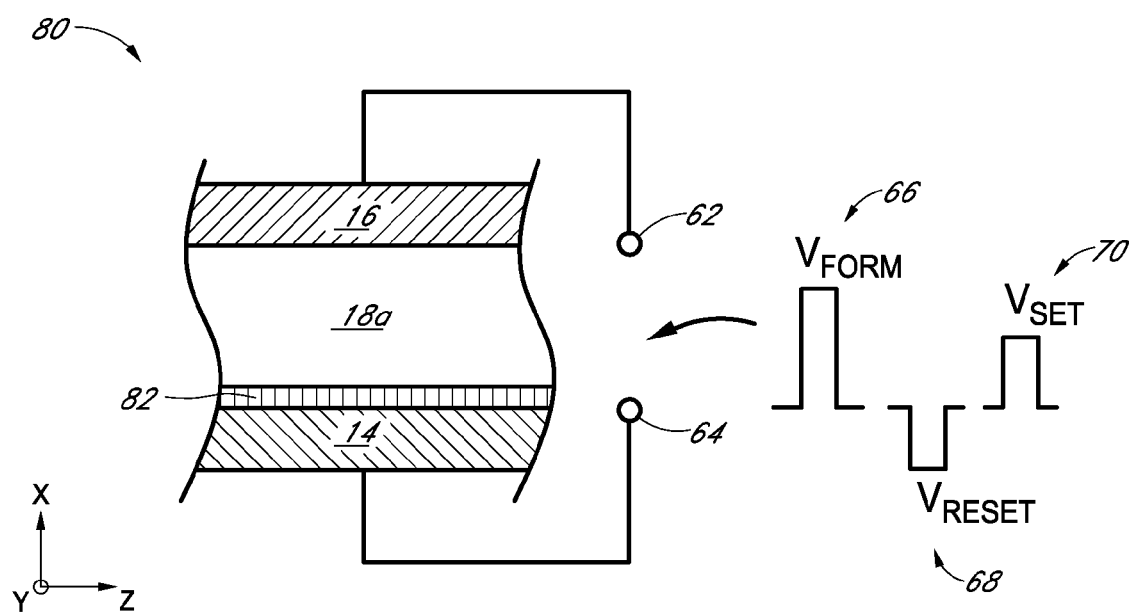
FIG. 5A is a schematic cross-sectional illustration of an RRAM cell stack according to some embodiments.

Referring to FIG. 5A, details, according to some embodiments, of the material stacks that comprise RRAM cells of FIGS. 1 and 2 are disclosed herein. An RRAM cell stack 80 of FIG. 5A can represent a cross-section taken of an RRAM cell along sections 5 in FIGS. 1 and 2. Similar to the RRAM cell stack 50 of FIG. 4A, the RRAM cell stack 80 comprises a first electrode 16, a second electrode 14, and a resistive switching material 18a comprising an oxide comprising a pnictogen element formed by atomic layer deposition (ALD), wherein the resistive switching material 18a is interposed between first and second electrodes 16 and 14. The structures and methods of materials and layers within the RRAM cell stack 80 that are similar to the structures and methods of materials and layers within the RRAM cell stack 50 discussed above in connection with FIG. 4A.

In addition, the RRAM cell stack 80 of FIG. 5A further includes a barrier layer 82 interposed between the second electrode 14 and the resistive switching material 18a. In various embodiments, discussed below in connection with FIGS. 5B-5D, when present, the barrier layer 82 may function to limit the current through the RRAM cell during programming. In addition, when present, the barrier layer 82 may improve the degree of nonlinearity of the current-voltage relationship of the RRAM cell stack 80 under both LRS and HRS states. In some embodiments, unlike the illustrated embodiment of FIG. 5A, the barrier layer 82 is interposed between the first electrode 16 and the resistive switching material 18a.

The barrier layer 82 can include a suitable dielectric material including metal oxides and nitrides, such as, e.g., $HfO_2$, $ZrO_2$, $Cu_2O$, $TaO_2$, $Ta_2O_5$, $TiO_2$, $SiO_2$, $Al_2O_3$, $Si_3N_4$, AlN, and SiON, among others, and mixtures thereof.

Several factors can be considered for choosing the material and dimensions for the barrier layer 82. One factor can be an electronic barrier offset between the conduction band of the barrier layer 82 and an electrode contacting the barrier layer 82 (the second electrode 14 in the illustrated embodiment). In general, a higher barrier offset between an electron-injecting electrode and the dielectric conduction band can result in lower tunneling currents during programming, which can lead to reduced current during programming. In some embodiments, the barrier offset between the conduction band of the barrier layer 82 and the electrode contacting the barrier layer 82 is between about 1.5 eV and about 4 eV, for instance about 2.5 eV.

In general, a thicker barrier can also result in lower tunneling currents during programming. On the other hand, a thicker barrier may increase the degree of nonlinearity. In some embodiments, the thickness of the barrier layer 82 is between about 1 nm and 10 nm, for instance about 2 nm.

In addition, as discussed in connection with FIGS. 1 and 2, the barrier layer 82 may be formed using thermal atomic layer deposition (ALD) according to some embodiments, which can be particularly advantageous for forming 3D RRAM memory cells.

In some embodiments, the barrier layer 82 includes $HfO_2$ and is deposited by thermal ALD using $HfCl_4$ and $H_2O$ as precursors. In some other embodiments, the barrier layer 82 including $HfO_2$ is deposited by thermal ALD by using TEMAHf or derivatives thereof as precursors of Hf with ozone and/or $H_2O$ as oxygen precursors. In some embodiments, the barrier layer 82 includes $Al_2O_3$ and is deposited by thermal ALD using TMA and $H_2O$ as precursors. In other embodiments, the barrier layer 82 includes $ZrO_2$ and is deposited by thermal ALD using $ZrCl_4$ and $H_2O$ as precursors. In yet other embodiments, the barrier layer 82 including $ZrO_2$ is deposited by thermal ALD by using TEMAZr or derivatives thereof as precursors of Zr with ozone and/or $H_2O$ as oxygen precursors.

Figure 5B:
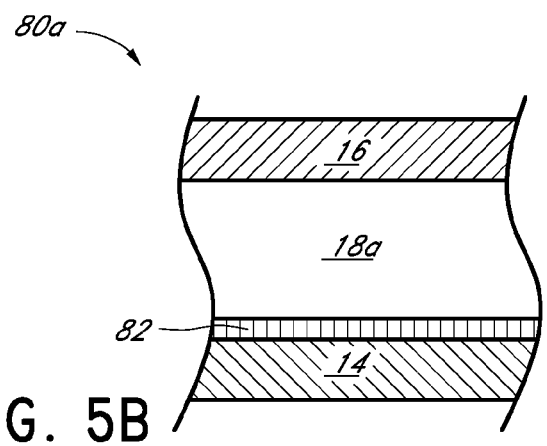
FIGS. 5B-5D are schematic cross-sectional illustrations of the RRAM cell stack of FIG. 5A at various stages of operation, according to some embodiments.
Figure 5C:
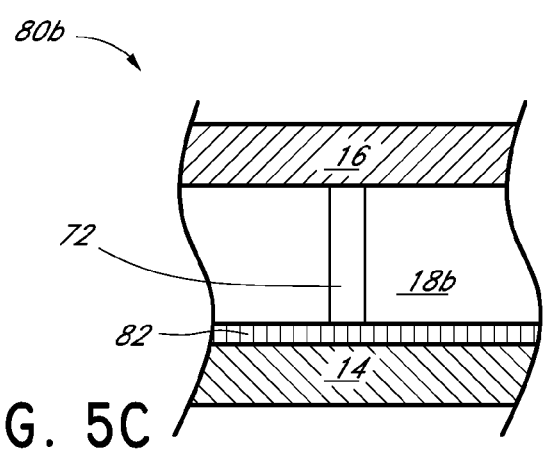
Figure 5D:
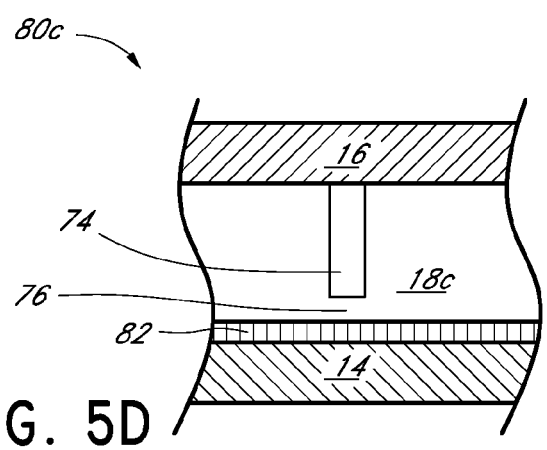

In FIGS. 5B to 5D physical changes to the resistive stack 100 during operation is described, according to some embodiments. As noted herein, while certain physical phenomena may be described herein as best understood, any embodiments described herein is not bound to any specific theory. FIG. 5B illustrates a cross-sectional view of an unformed RRAM cell stack 80a similar to the unformed RRAM cell stack 50a of FIG. 4B, according to some embodiments. Unlike FIG. 4B, the unformed RRAM cell stack 80a of FIG. 5B additionally includes a barrier layer 82 interposed between the resistive switching material 18a and the second electrode 14.

Similar to FIG. 4B, the unformed RRAM cell stack 80a of FIG. 5B can be a resistive switching material 18 that is a pnictogen oxide, or, in some other embodiments, that has as-deposited concentration profiles of elements of the base oxide and dopants as described above, and may not have substantially localized conduction paths.

FIG. 5C illustrates a cross-sectional view of an as-formed or as-SET RRAM cell stack 80b, according to some embodiments. Similar to FIG. 4C, the as-formed or as-SET RRAM cells stack 80b can represent the RRAM cell stack 50a after receiving pulses $V_{FORM}$ 66 and $V_{SET}$ 70 as illustrated in FIG. 5A. Also similar to FIG. 4B, the as-formed or as-SET RRAM cell stack 80b can include a localized conduction path 72 within the resistive switching material 18b. The formation process and the physical characteristics of the localized conduction path 72 can be substantially similar to the localized conduction path 72 discussed above in connection with FIG. 4C. Unlike FIG. 4C, however, the localized conduction path 72 of FIG. 5C can be interrupted or prevented from extending into the barrier layer 82.

Without being bound to any theory, the barrier layer 82 can interrupt and even prevent the formation of the conductive path 72 within the barrier layer 82 by retarding or preventing movement of metal atoms or ions, oxygen atoms or ions, oxygen vacancies, or any combination thereof within the barrier layer 82 overlapping the conductive path 72. One indication that the retardation or prevention of movement of the atoms and/or ions can be the relative melting temperatures of the barrier layer 82 and the resistive switching material 18, which can be an indirect indicator of the relative thermodynamic stability, as can be measured, for example, by Gibbs free energy of formation. For example, a resistive switching material according to some embodiments, $Sb_2O_5$ has a relatively low melting temperature of about 525° C. As an illustrative comparison, $HfO_2$ has a relatively high melting temperature of greater than 2700° C. In some embodiments, the melting temperature of the barrier layer 82 is higher than the melting temperature of the resistive switching material 18 by about 1× to about 3×, for instance about 2×. In some embodiments, the melting temperature of the barrier layer 82 is higher than the melting temperature of the resistive switching material 18 by about 3× to about 5×, for instance about 4×.

Similar to FIG. 4C, the as-SET RRAM cell stack 80b of FIG. 5C can be characterized electrically by a relatively localized conduction through the localized conduction region 72. Unlike FIG. 4B, however, the as-formed or as-SET RRAM cell stack 80b of FIG. 5B can be characterized electrically by a non-Ohmic conduction having a relatively higher degree of non-linearity in the current-voltage (I-V) relationship compared to the as-formed or as-SET RRAM cell stack 50b of FIG. 4C.

Similar to FIG. 4C, it will be appreciated that while FIG. 5C depicts a single localized conduction path 72 having a particular shape, however this representation is schematic and for illustrative purposes only and actual configurations can be different. For example, in some embodiments, the as-SET RRAM cell stack 80b of FIG. 5C can have multiple localized conduction paths 72. In addition, the shape can take any arbitrary form.

FIG. 5D illustrates a cross-sectional view of an as-RESET RRAM cell stack 80c of the RRAM cell of FIG. 5A, according to some embodiments. That is, the as-RESET RRAM cells stack 80c can represent a previously formed or SET RRAM cell stack 80b of FIG. 5C, after having received the pulse $V_{RESET}$ 68. The layers and materials included in the as-RESET RRAM cell stack 50c of FIG. 4D are similarly included in the as-RESET RRAM cell stack 80c of FIG. 5D. In addition, the as-RESET RRAM cell stack 80c of FIG. 5D also includes the barrier layer 82 interposed between the localized conduction path 72 and the second electrode 14. The formation process and the physical characteristics of the localized conduction path 72 and the gap region 76 can be substantially similar to the localized conduction path 72 and the gap region 76 discussed above in connection with FIG. 4D. For example, the gap region 76 is disposed between the conductive path 74 and the second electrode 14. Unlike FIG. 4D, however, the localized conduction path 72 of FIG. 5C can be further interposed by the barrier layer 82.

Also similar to FIG. 4D, the as-RESET RRAM cell stack 80c of FIG. 5D can also be characterized electrically by a relatively localized conduction through the localized conduction path 74 and through the gap region 76. Unlike FIG. 4D, however, because electrons also traverse the barrier layer 82, in some embodiments, the as-RESET RRAM cell stack 80c of FIG. 5D can be characterized electrically by a higher degree of non-linearity as compared to the as-RESET RRAM cell stack 50c of FIG. 4D, for example by about 10×. In some embodiments, for example, the degree of nonlinearity (defined as the ratio of current at VSET START/current at 0.5 VSET START) for an as-RESET RRAM stack 80c of FIG. 5D can be between about 100 and about 10,000, or between about 10 and about 10,000, for instance about 2,000.

Also similar to FIG. 4D, FIG. 5D depicts a single localized conduction path 74 having a particular shape, this schematic representation is for illustrative purposes only and actual configurations can be different. For example, in some embodiments, the as-RESET RRAM cell stack 80c of FIG. 5D can have multiple localized conduction paths 74. In addition, the shape can take any arbitrary form. Alternatively, the conduction path may be non-localized and extending over an entire area of the cell.

Figure 6:
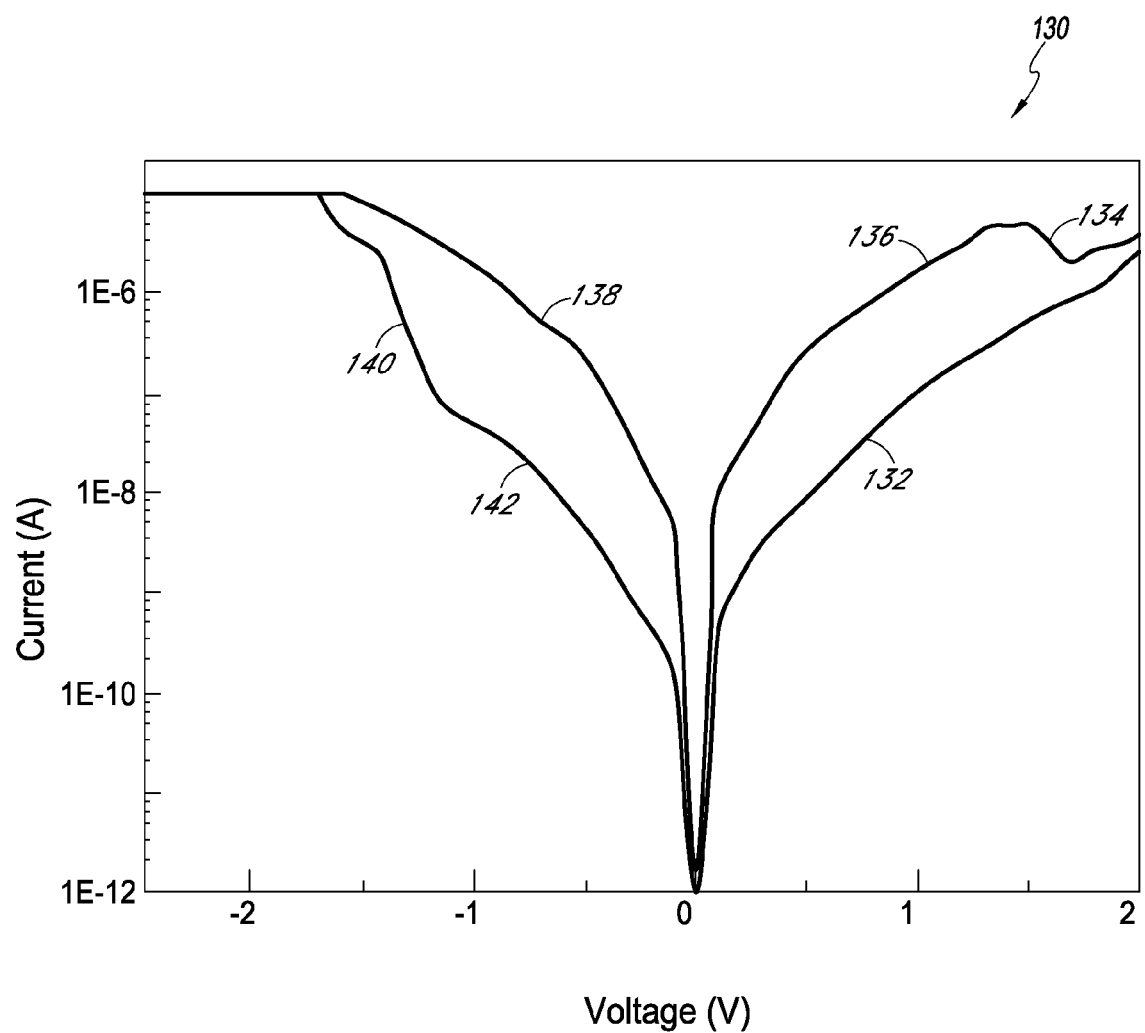
FIG. 6 is an illustration of the measured current-voltage relationship for an RRAM cell according to some embodiments.

FIG. 6 illustrates experimental I-V curves of an RRAM cell comprising a resistive switching material comprising an oxide having a pnictogen element, which can be deposited by thermal atomic layer deposition, according to an embodiment.

The I-V curve 130 of FIG. 6 corresponds to an RRAM cell including a TiN bottom electrode (corresponding to the second electrode 14 in FIG. 4A), 10 nm $Sb_2O_5$ resistive switching material on the TiN bottom electrode, and a Pt top electrode (corresponding to the first electrode 16 in FIG. 4A). The I-V curve was formed and measured under a compliance current of $1\times10^{-5}$ A during the SET operation, which can limit the steady state current passing though the RRAM cell.

A SET portion of the I-V curve 130 of FIG. 6 includes a SET HRS I-V portion 142 ranging in the voltage axis from an a $V_{INIT}$ of about zero to $V_{SET\ START}$ of about −1.2V, a SET HRS-to-LRS transition I-V portion 140, and a SET return I-V portion 138 from $V_{SET\ END}$ of about −1.5V to $V_{INIT}$ of about zero.

A RESET portion of the I-V curve 130 of FIG. 6 includes a RESET LRS I-V portion 136 ranging in the voltage axis from an a $V_{INIT}$ of about zero to $V_{RESET\ START}$ of about 1.5V, a RESET LRS-to-HRS transition I-V portion 134, and a RESET return I-V portion 132 from $V_{RESET\ END}$ of about 2.0V to $V_{INIT}$ of about zero.

The I-V curves of FIG. 6 illustrates an ON/OFF current ratio of about 40 between the LRS and HRS states measured at −300 mV. In addition, a degree of nonlinearity of between about 10 and 100 can be observed in both LRS and HRS states, which can indicate the presence of a conductive path region that does not extend completely between the second electrode and the metallic material.

As discussed above, having low access currents (SET current and RESET current) can be generally advantageous, and more particularly in scaling the lateral dimensions of the memory cell. It will be appreciated that the RRAM cell of FIG. 6 has peak SET and RESET currents that are below about 10 µA, which can be particularly advantageous for scaling the lateral dimensions below about 10 nm and integrating with selector devices such as diodes, thrystors, ovonic threshold devices, among others.

It will be appreciated that various modifications to the embodiments described herein are possible. For example, in some embodiments, the interface between the pnictogen element oxide (e.g., $SbO_x$) layer and the layer of the metallic pnictogen element (e.g., Sb) may not be abrupt but may be gradual. For example, by intermixing or alternating cycles of the oxide deposition process and the metal element deposition process, an interface region with a nano-laminate structure may be formed. The nanolaminate may include alternating layers of the pnictogen element oxide and the pnictogen element. A gradual, or graded, interface may be formed by gradually decreasing the pnictogen element oxide (e.g., $SbO_x$) content and increasing the pnictogen element (e.g., Sb) content throughout this nano-laminate structure, as the materials composition transitions from the pnictogen element oxide to the pnictogen element. Increasing the content of one material can be accomplished by increasing the number of deposition cycles of that material relative to the other material. For example, the ratio of pnictogen element deposition cycles compared to pnictogen element oxide deposition cycles may increase as the stack transitions from a pnictogen element oxide layer to a pnictogen element layer.

In some embodiments, RRAM cells comprising a nanolaminate structure do not require a forming step.

In some embodiments, the entire resistive switching stack may be formed by a nanolaminate structure of pnictogen element oxide (e.g., $SbO_x$) layers alternated by pnictogen element (e.g., Sb) layers so that a desired oxygen deficiency is created throughout the layer. In some embodiments, the pnictogen element layers forming the nanolaminate may be thinner than the pnictogen element oxide layers.

In addition, it will be appreciated by those skilled in the art that various omissions, additions and modifications can be made to the processes described above without departing from the scope of the invention, and all such modifications and changes are intended to fall within the scope of the invention, as defined by the appended claims.

What is claimed is:

1. A method of fabricating a memory cell, comprising:
   providing a substrate;
   providing a first electrode on the substrate; and
   depositing, via atomic layer deposition, a resistive switching material on the first electrode, wherein the resistive switching material comprises an oxide comprising a pnictogen chosen from the group consisting of As, Bi, Sb, and P,
   wherein depositing the resistive switching material comprises subjecting the substrate to temporarily spaced-apart exposures to a pnictogen-containing reactant and to an oxygen-containing reactant, wherein the substrate is exposed to the pnictogen-containing reactant and to the oxygen-containing reactant at different times, and
   wherein depositing the resistive switching material comprises depositing a substoichiometric oxide by providing an exposure level of the oxygen-containing reactant at a level lower than a level sufficient for forming a substantially stoichiometric oxide.

2. The method of claim 1, further comprising forming a second electrode on the resistive switching material wherein the resistive switching material contacts and is interposed between the first and second electrodes.

3. The method of claim 2, wherein forming at least one of the first electrode and the second electrode comprises depositing a TiN layer.

4. The method of claim 3, wherein forming the at least one of the first electrode and the second electrode comprises depositing the TiN layer via atomic layer deposition using precursors comprising $TiCl_4$ and $NH_3$.

5. The method of claim 3, wherein forming the at least one of first electrode and the second electrode comprises depositing the TiN layer at a substantially matched temperature as a deposition temperature of the resistive switching material.

6. The method of claim 1, wherein depositing via atomic layer deposition comprises performing a non-plasma, thermal atomic layer deposition.

7. The method of claim 6, wherein the non-plasma, thermal atomic layer deposition is performed at a temperature between about 100° C. and about 400° C.

8. The method of claim 1, wherein the pnictogen is Sb.

9. The method of claim 1, wherein the oxygen-containing reactant comprises one of ozone or $H_2O$.

10. A method of fabricating a memory cell, comprising:
    providing a substrate;
    providing a first electrode on the substrate; and
    depositing, via atomic layer deposition, a resistive switching material on the first electrode, wherein the resistive switching material comprises an oxide comprising a pnictogen chosen from the group consisting of As, Bi, Sb, and P,
    wherein depositing the resistive switching material comprises subjecting the substrate to temporarily spaced-apart exposures to a pnictogen-containing reactant and to an oxygen-containing reactant, wherein the substrate is exposed to the pnictogen-containing reactant and to the oxygen-containing reactant at different times,
    wherein forming the resistive switching material comprises doping the resistive switching material with a dopant, and
    wherein doping the resistive switching material comprises exposing the substrate to a dopant-containing reactant between exposing the substrate to the pnictogen-containing reactant and exposing the substrate to the oxygen-containing reactant.

11. The method of claim 10, wherein doping the resistive switching material comprises exposing the substrate to a dopant-containing reactant after an exposure of the substrate to the oxygen-containing reactant and before a subsequent exposure of the substrate to the pnictogen-containing reactant.

12. The method of claim 11, wherein exposing the substrate to the dopant-containing reactant comprises exposing the substrate to a second pnictogen-containing reactant different from the pnictogen-containing reactant.

13. The method of claim 12,
    wherein exposing the substrate to the pnictogen-containing reactant comprises exposing the substrate to a pnictogen-containing reactant chosen from the group consisting of Sb halides, Sb alkoxides, Sb alkylamines, Sb alkylamides and Sb alkylsilyls, and wherein exposing the substrate to the second pnictogen-containing reactant comprises exposing the substrate to another one of pnictogen-containing reactants chosen from the group consisting of Sb halides, Sb alkoxides, Sb alkylamines, Sb alkylamides and Sb alkylsilyls.

14. The method of claim 13, wherein exposing the substrate to the pnictogen-containing reactant comprises exposing the substrate to an Sb halide, and wherein exposing the substrate to the second pnictogen-containing reactant comprises exposing the substrate to an Sb alkylsilyl.

15. The method of claim 13, wherein exposing the substrate to the dopant-containing reactant further comprises exposing the substrate to a metal-containing reactant having a metal chosen from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te.

16. The method of claim 15, wherein exposing the substrate to the second pnictogen-containing reactant comprises exposing the substrate to an Sb alkylsilyl, and wherein exposing the substrate to the metal-containing reactant comprises exposing the substrate to a halide of the metal.

17. The method of claim 10, wherein exposing the substrate to the dopant-containing reactant comprises exposing the substrate to a metal-containing reactant having a metal chosen from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te.

18. The method of claim 17, wherein the pnictogen-containing reactant is chosen from the group consisting of Sb halides, Sb alkoxides, Sb alkylamines, Sb alkylamides and Sb alkylsilyls, and wherein the metal-containing reactant is chosen from the group consisting of halides of the metal, alkoxides of the metal, alkylamines of the metal, alkylamides of the metal and alkylsilyls of the metal.

19. The method of claim 10, wherein doping further comprises exposing the substrate to a plurality of temporally spaced-apart exposures of a dopant-containing reactant, wherein a number of exposures of the resistive switching material to the dopant-containing reactant varies at different levels in the resistive switching material such that the resistive switching material has an as-deposited gradient in dopant concentration across at least a portion of a total thickness of the resistive switching material.

20. The method of claim 10, wherein doping comprises forming a dopant layer.

21. The method of claim 20, wherein the dopant layer is interposed between layers of the oxide.

22. The method of claim 21, further comprising forming a nanolaminate comprising alternating dopant layers and layers of the oxide over at least part of a total thickness of the resistive switching material.

23. The method of claim 22, wherein the dopant layers have thicknesses that vary across the at least part' of the total thickness of the resistive switching material such that the resistive switching material has an as-deposited gradient in dopant concentration across the thickness of the resistive switching material.

24. The method of claim 22, wherein layers of the oxide have thicknesses that vary across the at least part of the total thickness of the resistive switching material such that the resistive switching material has an as-deposited gradient in dopant concentration across the thickness of the resistive switching material.

25. A method of fabricating a memory cell, comprising:
providing a substrate;
providing a first electrode on the substrate; and
depositing, via atomic layer deposition, a resistive switching material on the first electrode, wherein the resistive switching material comprises an oxide comprising a pnictogen chosen from the group consisting of As, Bi, Sb, and P,
wherein forming the first electrode comprises providing a plurality of vertically-spaced apart first electrode layers, further comprising:
forming a hole extending vertically through the plurality of first electrode layers,
wherein depositing the resistive switching material comprises lining sidewalls of the hole with the resistive switching material by depositing via atomic layer deposition the oxide comprising the pnictogen.

26. The method of claim 25, wherein the hole has an aspect ratio exceeding about 20:1.

27. The method of claim 25, wherein surfaces of the sidewalls comprise a heterogeneous composition.

28. The method of claim 27, wherein surfaces of the sidewall has alternating insulating regions and conductive regions through the first electrode layers.

29. A method of fabricating a memory cell, comprising:
providing a substrate;
providing a first electrode on the substrate; and
depositing, via atomic layer deposition, a resistive switching material on the first electrode, wherein the resistive switching material comprises an oxide comprising a pnictogen chosen from the group consisting of As, Bi, Sb, and P,
wherein providing the first electrode comprises:
providing a sacrificial layer over a substrate surface;
forming a hole extending vertically through the sacrificial layer; and
forming the first electrode by filling the hole with a second electrode material, and
wherein the method further comprises removing the sacrificial layer to form a recess, and
wherein depositing the resistive switching material comprises lining the recess with the resistive switching material.

30. A resistive random access memory device comprising a memory cell, the memory cell comprising:
a first electrode;
a second electrode; and
a resistive switching material contacting and interposed between the first and second electrodes,
wherein the resistive switching material comprises an oxide comprising a pnictogen chosen from a group consisting of As, Bi, Sb, and P,
wherein at least one of the first and second electrodes comprises a metal nitride, and
wherein the resistive random access memory device comprises a plurality of first electrodes formed at different vertical levels, and wherein the second electrode includes a vertically-extending conductive rod.

31. The resistive random access memory device of claim 30, wherein the first electrode is disposed over a surface of a substrate, the first electrode having a major surface substantially parallel to the surface of the substrate and a hole extending vertically therein, and wherein the resistive switching material lines sidewall surfaces of the hole.

32. The resistive random access memory device of claim 30, wherein the pnictogen comprises Sb.

33. The resistive random access memory device of claim 30, wherein the resistive switching material is doped with a metal.

34. The resistive random access memory device of claim 33, wherein the metal comprises a pnictogen.

35. The resistive random access memory device of claim 33, wherein the metal is chosen from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te.

36. The resistive random access memory device of claim 33, wherein the doped metal forms a dopant layer interposed by adjacent oxide layers.

37. The resistive random access memory device of claim 30, wherein the memory cell has peak access currents of about $1\times10^{-5}$ A or less.

* * * * *